US012356090B2

(12) United States Patent
    Kodama

(10) Patent No.: US 12,356,090 B2
(45) Date of Patent: Jul. 8, 2025

(54) IMAGING DEVICE AND IMAGING METHOD

(71) Applicant: SONY SEMICONDUCTOR SOLUTIONS CORPORATION, Kanagawa (JP)

(72) Inventor: Kazutoshi Kodama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 47 days.

(21) Appl. No.: 17/998,678

(22) PCT Filed: Apr. 28, 2021

(86) PCT No.: PCT/JP2021/017017
§ 371 (c)(1),
(2) Date: Nov. 14, 2022

(87) PCT Pub. No.: WO2021/241120
PCT Pub. Date: Dec. 2, 2021

(65) Prior Publication Data
US 2023/0179879 A1    Jun. 8, 2023

(30) Foreign Application Priority Data
May 28, 2020    (JP) ................... 2020-093556

(51) Int. Cl.
    *H04N 25/47*    (2023.01)
    *H04N 25/63*    (2023.01)
    (Continued)

(52) U.S. Cl.
    CPC ............ *H04N 25/47* (2023.01); *H04N 25/63* (2023.01); *H04N 25/65* (2023.01); *H04N 25/78* (2023.01); *H10F 39/8057* (2025.01)

(58) Field of Classification Search
    CPC ........ H04N 25/47; H04N 25/63; H04N 25/78; H04N 25/65; H04N 23/60; H04N 25/633; H01L 27/14623
    See application file for complete search history.

(56) References Cited

U.S. PATENT DOCUMENTS 9,231,591 B1    1/2016  Lesea
2010/0182468 A1  7/2010 Posch
(Continued)

FOREIGN PATENT DOCUMENTS

CN    107147856 A    9/2017
CN    109842768 A    6/2019
(Continued)

OTHER PUBLICATIONS

International Search Report and Written Opinion of PCT Application No. PCT/JP2021/017017, issued on Jul. 20, 2021, 10 pages of ISRWO.

(Continued)

*Primary Examiner* — Nhan T Tran
(74) *Attorney, Agent, or Firm* — CHIP LAW GROUP

(57) ABSTRACT

There is no possibility of causing a useless event.
An imaging device includes: a photoelectric conversion unit including a plurality of photoelectric conversion elements that performs photoelectric conversion to generate an electrical signal; a setting unit that sets a threshold value according to a noise level of a predetermined area of the plurality of photoelectric conversion elements; and a first detection unit that detects a detection signal in a case where a change amount of the electrical signal generated by the plurality of photoelectric conversion elements exceeds the threshold value.

15 Claims, 27 Drawing Sheets

(51) Int. Cl.
  *H04N 25/65* (2023.01)
  *H04N 25/78* (2023.01)
  *H10F 39/00* (2025.01)

(56) References Cited

U.S. PATENT DOCUMENTS

| | | |
|---|---|---|
| 2017/0033777 A1 | 2/2017 | Kim |
| 2018/0109736 A1* | 4/2018 | Ishii .................. H04N 23/76 |
| 2018/0191972 A1 | 7/2018 | Berner |
| 2020/0058205 A1 | 2/2020 | Yaffe |
| 2020/0312899 A1* | 10/2020 | Seo .................. H04N 25/633 |

FOREIGN PATENT DOCUMENTS

| | | | |
|---|---|---|---|
| CN | 110868518 A | 3/2020 | |
| CN | 111064865 A | 4/2020 | |
| JP | 2017-535999 A | 11/2017 | |
| JP | 2019134271 A * | 8/2019 | ........... H04N 23/667 |
| WO | WO-2020066432 A1 * | 4/2020 | ............. G01K 1/026 |
| WO | WO-2020066803 A1 * | 4/2020 | ....... H01L 27/14603 |

OTHER PUBLICATIONS

Zhao, Hui; Geng, Li, An Ultra-Dynamic Voltage Scalable (U-DVS) SRAM Design, The New Type of Industrialization, No. 6, Jun. 20, 2013, 9 pages.
Nozaki, Yuji; Delbruck, Tobi, Temperature and Parasitic Photocurrent Effects in Dynamic Vision Sensors, «IEEE Transactions On Electron Devices» Aug. 21, 2017, 7 pages.

* cited by examiner

IMAGING DEVICE AND IMAGING METHOD

CROSS REFERENCE TO RELATED APPLICATIONS

This application is a U.S. National Phase of International Patent Application No. PCT/JP2021/017017 filed on Apr. 28, 2021, which claims priority benefit of Japanese Patent Application No. JP 2020-093556 filed in the Japan Patent Office on May 28, 2020. Each of the above-referenced applications is hereby incorporated herein by reference in its entirety.

TECHNICAL FIELD

The present disclosure relates to an imaging device and an imaging method.

BACKGROUND ART

As one of event-driven imaging devices, an asynchronous imaging device called a dynamic vision sensor (DVS) has been proposed (see, for example, Patent Document 1). In the asynchronous imaging device, only when a certain event (for example, movement) occurs in a scene, data of a portion where a luminance level has changed, the portion being caused by the event, is acquired. Therefore, the asynchronous imaging device can acquire image data at a much higher speed than a general synchronous imaging device that unnecessarily acquires all data of an image at a fixed frame rate.

CITATION LIST

Patent Document

Patent Document 1: JP 2017-535999 A

SUMMARY OF THE INVENTION

Problems to be Solved by the Invention

Since the DVS is excellent in sensitivity, the DVS also reacts to a change in an electrical signal due to noise of a photoelectric conversion element in the imaging device, and may generate an event even in a scene where there is originally no motion. Furthermore, generating unnecessary events that are originally necessary increases the power consumption of the DVS.

Therefore, the present disclosure provides an imaging device and an imaging method that do not cause a useless event.

Solutions to Problems

In order to solve the above problems, according to the present disclosure, there is provided an imaging device including:
 a photoelectric conversion unit including a plurality of photoelectric conversion elements that performs photoelectric conversion to generate an electrical signal;
 a setting unit that sets a threshold value according to a noise level of a predetermined area of the plurality of photoelectric conversion elements; and
 a first detection unit that detects a detection signal in a case where a change amount of the electrical signal generated by the plurality of photoelectric conversion elements exceeds the threshold value.

The photoelectric conversion elements in the predetermined area may be shielded from light, and
 the photoelectric conversion elements other than the predetermined area each photoelectrically may convert incident light to generate the electrical signal.

The plurality of photoelectric conversion elements may be arranged in a two-dimensional matrix, and a light shielding area where light is shielded may correspond to at least one of an arrangement of the photoelectric conversion elements in a row unit or an arrangement of the photoelectric conversion elements in a column unit.

The arrangement of the photoelectric conversion elements in a row unit and the arrangement of the photoelectric conversion elements in a column unit may include end portions of the plurality of photoelectric conversion elements arranged in a two-dimensional matrix.

The setting unit may set the threshold value on the basis of a number of absolute values of the change amount of the electrical signal generated by photoelectric conversion elements in the predetermined area exceeding the threshold value in a predetermined period.

The first detection unit may detect a first detection signal when an absolute value of a change amount in a direction in which a signal level of the electrical signal increases exceeds a first threshold value, and may detect a second detection signal when an absolute value of a change amount in a direction in which the signal level of the electrical signal decreases exceeds a second threshold value, and
 the setting unit
 may set the first threshold value on the basis of a number of absolute values of the change amount in the direction in which the signal level of the electrical signal generated by the electric conversion element in the predetermined area increases exceeding the first threshold value in a predetermined period, and
 may set the second threshold value on a basis of a number of absolute values of the change amount in the direction in which the signal level of the electrical signal generated by the electric conversion element in the predetermined area decreases exceeding the second threshold value in a predetermined period.

The setting unit may set the threshold value in stages on the basis of a number exceeding the threshold value in the predetermined period.

The setting unit may decrease a change rate of the threshold value as time elapses.

The setting unit may decrease the change rate of the threshold value in a manner that the value asymptotically approaches an initial setting value.

After setting the threshold value to a threshold value in a first stage, the setting unit may decrease the change rate in a manner that the rate asymptotically approaches a predetermined setting value.

The setting unit does not have change the threshold value in a case where a number exceeding the threshold value in the predetermined period is less than a predetermined value.

A setting unit may set the threshold value according to temperatures corresponding to the plurality of photoelectric conversion elements.

The setting unit may increase the change rate of the threshold value as a change in the temperature increases.

The first detection unit may sequentially read the electrical signals of the photoelectric conversion elements in the predetermined area, and the setting unit may count the number of the detection signals exceeding the threshold value over a predetermined period.

In order to solve the above problem, according to the present disclosure, there is provided an imaging method including:

setting a threshold value according to a noise level of a light-shielded photoelectric conversion element; and detecting a detection signal in a case where an absolute value of a change amount of an electrical signal generated by the plurality of photoelectric conversion elements each of which photoelectrically converts incident light to generate the electrical signal exceeds the threshold value.

MODE FOR CARRYING OUT THE INVENTION

Hereinafter, embodiments of an imaging device and an imaging method will be described with reference to the drawings. Although main components of the imaging device will be mainly described below, the imaging device may have components and functions that are not illustrated or described. The following description does not exclude components and functions that are not illustrated or described.

First Embodiment

Figure 1:
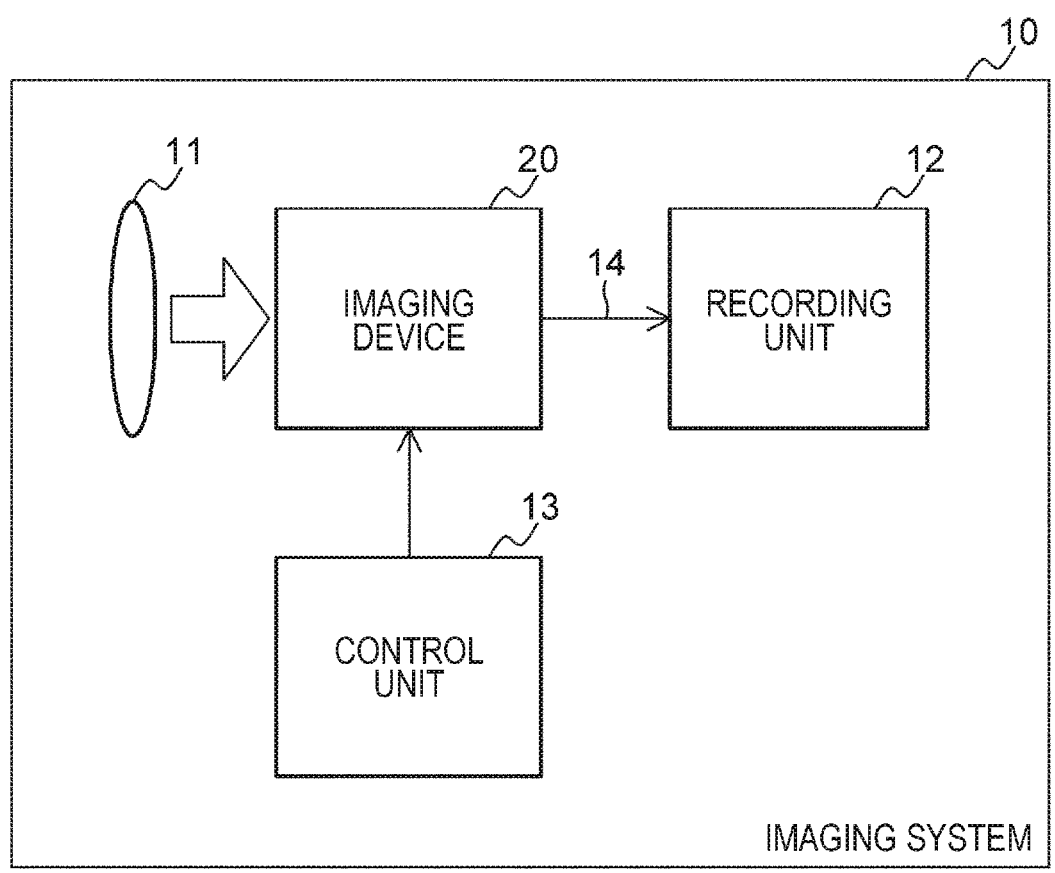
FIG. 1 is a block diagram illustrating an example of a system configuration of an imaging system to which the technology according to the present disclosure is applied.

FIG. 1 is a block diagram illustrating an example of a system configuration of an imaging system to which the technology according to the present disclosure is applied.

As illustrated in FIG. 1, an imaging system 10 to which the technology according to the present disclosure is applied includes an imaging lens 11, a recording unit 12, a control unit 13, and an imaging device 20. The imaging system 10 is an example of an electronic device of the present disclosure, and examples of the electronic device include a camera system mounted on an industrial robot, an on-board camera system, and the like.

In the imaging system 10 having the above configuration, the imaging lens 11 captures incident light from a subject and forms an image on an imaging surface of the imaging device 20. The imaging device 20 photoelectrically converts incident light captured by the imaging lens 11 in units of pixels to acquire imaging data. As the imaging device 20, an imaging device of the present disclosure described later is used.

The imaging device 20 executes predetermined signal processing such as image recognition processing on the captured image data, and outputs data indicating a processing result and a detection signal (hereinafter, it may be simply described as a "detection signal") of an address event to be described later to the recording unit 12. A method of generating the detection signal of the address event will be described later. The recording unit 12 stores data supplied from the imaging device 20 via a signal line 14. The control unit 13 includes, for example, a microcomputer, and controls an imaging operation in the imaging device 20.

[Imaging Device According to First Configuration Example (Arbiter Method)]

Figure 2:
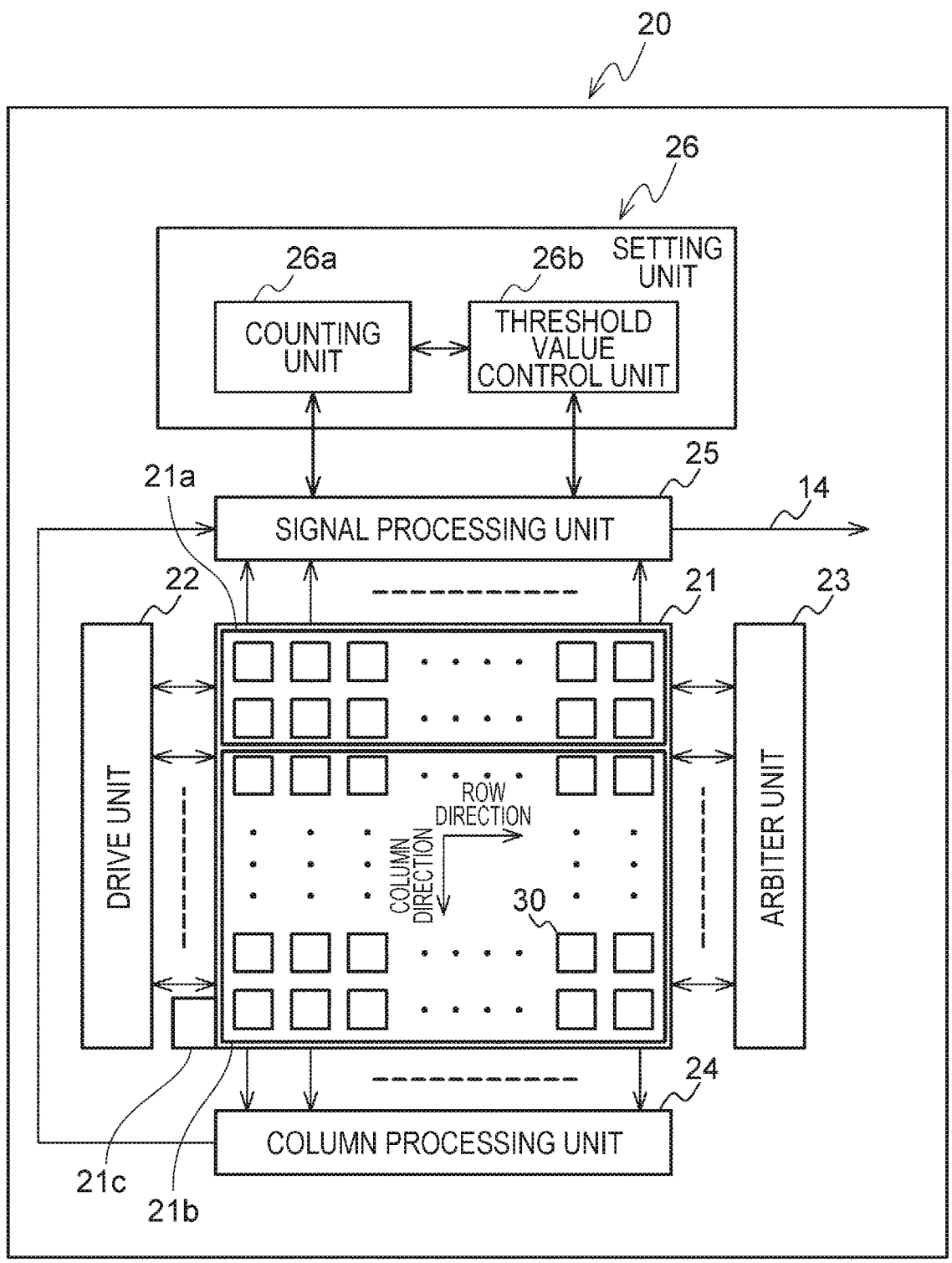
FIG. 2 is a block diagram illustrating an example of a configuration of an imaging device according to a first configuration example of the present disclosure.

FIG. 2 is a block diagram illustrating an example of a configuration of an imaging device according to a first configuration example used as the imaging device 20 in the imaging system 10 to which the technology according to the present disclosure is applied.

As illustrated in FIG. 2, the imaging device 20 according to the first configuration example as the imaging device of the present disclosure is an asynchronous imaging device called DVS, and includes a pixel array unit 21, a drive unit 22, an arbiter unit (arbitration unit) 23, a column processing unit 24, a signal processing unit 25, and a setting unit 26. Furthermore, the setting unit 26 includes a counting unit 26a and a threshold value control unit 26b.

In the imaging device 20 having the above configuration, a plurality of pixels 30 is two-dimensionally arranged in a matrix (array) in the pixel array unit 21. A vertical signal line VSL to be described later is wired for each pixel column with respect to this matrix-like pixel arrangement.

Each of the plurality of pixels 30 generates an analog signal of a voltage corresponding to a photocurrent as a pixel signal. Furthermore, each of the plurality of pixels 30 detects the presence or absence of an address event on the basis of whether or not the change amount of the photocurrent exceeds a predetermined threshold value. Then, when an address event occurs, the pixel 30 outputs a request to the arbiter unit 23.

Furthermore, the pixel array unit 21 is provided with a light shielding area 21a that shields light. On the other hand, a light receiving area 21b is provided in the pixel array unit 21 other than the light shielding area 21a.

The light shielding area 21a is provided corresponding to, for example, the plurality of pixels 30 in units of rows at the upper end portion. Alternatively, they may be provided corresponding to the plurality of pixels 30 in units of columns. As described above, the light shielding area 21a is provided in at least one of the upper end portion, the lower end portion, the left end portion, or the right end portion of the pixel array unit 21 to cover the plurality of pixels 30. The configuration of the pixel 30 in the light shielding area 21a is the same as that of the pixel 30 other than the light shielding area 21a, except that light is not incident. Therefore, the plurality of pixels 30 in the light shielding area 21a detects the presence or absence of an address event on the basis of, for example, whether or not the change amount of the current due to dark time noise exceeds a predetermined threshold value. Furthermore, in the present embodiment, the pixel 30 in the light shielding area 21a may be referred to as a light shielding pixel 30.

A temperature sensor 21c acquires temperatures corresponding to the plurality of pixels 30 in the pixel array unit 21, and supplies a signal including temperature information to the threshold value control unit 26b of the setting unit 26.

The drive unit 22 drives each of the plurality of pixels 30 arranged in the light receiving area 21b other than the light shielding area 21a to output the pixel signal generated in each pixel 30 to the column processing unit 24.

The arbiter unit 23 arbitrates a request from each of the plurality of pixels 30 and transmits a response based on the arbitration result to the pixel 30. The pixel 30 that has received the response from the arbiter unit 23 supplies a detection signal indicating a detection result (detection signal of the address event) to the drive unit 22 and the signal processing unit 25. The reading of the detection signal from the pixel 30 can be performed by reading a plurality of rows.

The column processing unit 24 includes, for example, an analog-digital converter, and performs processing of converting an analog pixel signal output from the pixel 30 of the row into a digital signal for each pixel column of the pixel array unit 21. Then, the column processing unit 24 supplies the analog-digital converted digital signal to the signal processing unit 25.

The signal processing unit 25 executes predetermined signal processing such as correlated double sampling (CDS) processing or image recognition processing on the digital signal supplied from the column processing unit 24. Then, the signal processing unit 25 supplies the data indicating the processing result and the detection signal supplied from the arbiter unit 23 to the recording unit 12 (see FIG. 1) via the signal line 14.

The setting unit 26 sets a threshold value for detecting the presence or absence of an address event. For example, the setting unit 26 sets the threshold value according to the noise level of the plurality of light shielding pixels 30. The counting unit 26a counts the address event generated in the light shielding pixel 30.

The threshold value control unit 26b sets a threshold value for detecting the presence or absence of an address event in the address event detection unit 33 to be described later according to the number of address events counted by the counting unit 26a. The threshold value control unit 26b includes, for example, a register, and can set the threshold value of the address event and the threshold value of the number of occurrences of the address event by the register. Note that the details of the threshold value control unit 26b will be described later.

[Configuration Example of Pixel Array Unit]

Figure 3:
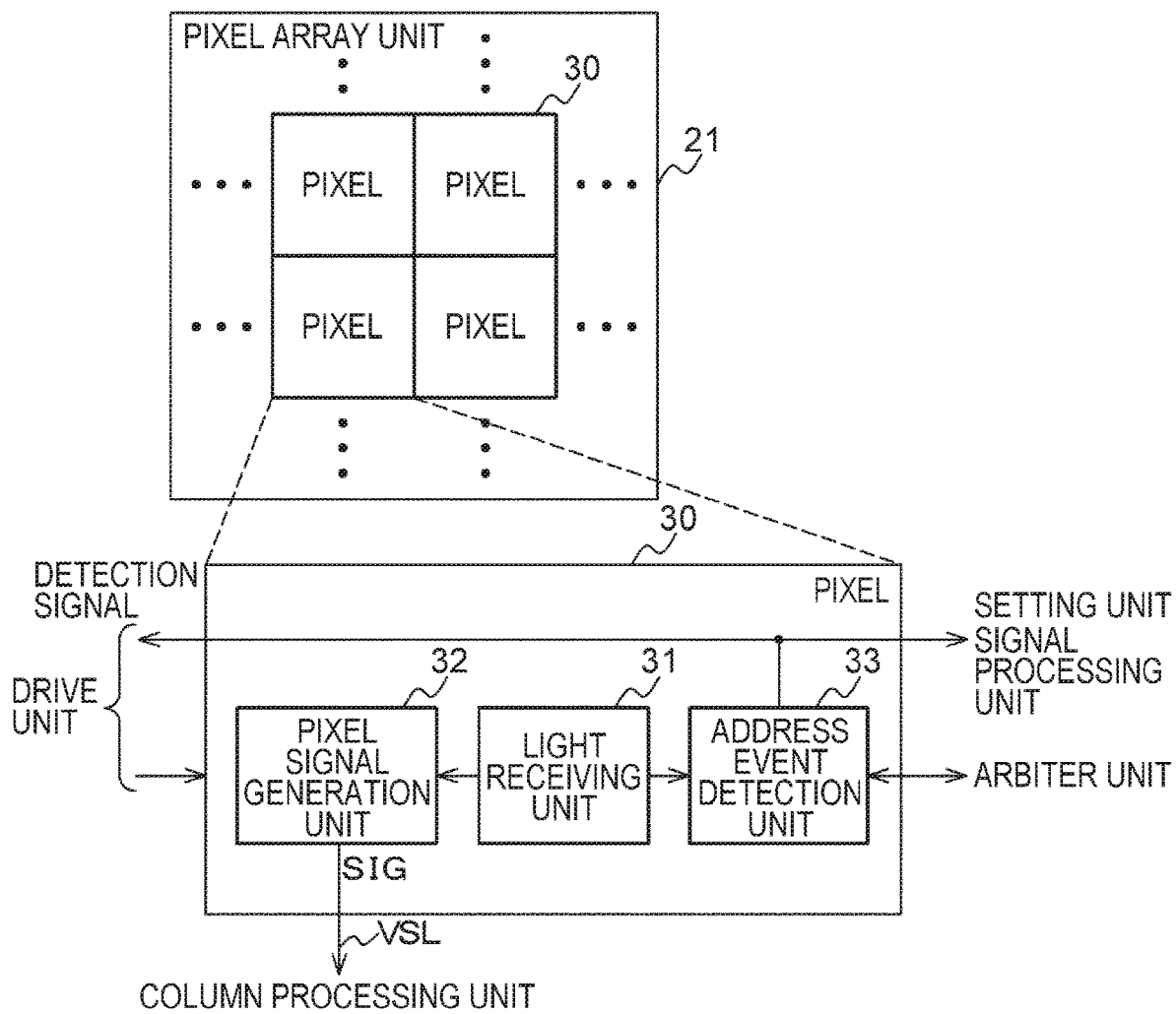
FIG. 3 is a block diagram illustrating an example of a configuration of a pixel array unit.

FIG. 3 is a block diagram illustrating an example of a configuration of the pixel array unit 21.

In the pixel array unit 21 in which the plurality of pixels 30 is two-dimensionally arranged in a matrix, each of the plurality of pixels 30 includes a light receiving unit 31, a pixel signal generation unit 32, and an address event detection unit 33.

In the pixel 30 having the above configuration, the light receiving unit 31 in the light receiving area 21b photoelectrically converts the incident light to generate a photocurrent. Then, the light receiving unit 31 supplies the photocurrent generated by photoelectric conversion to either the pixel signal generation unit 32 or the address event detection unit 33 under the control of the drive unit 22 (see FIG. 2).

On the other hand, the light receiving unit 31 of the light shielding pixel outputs an output current corresponding to a noise component such as a dark current. Then, the light receiving unit 31 of the light shielding pixel supplies a current corresponding to the noise component to the address event detection unit 33 under the control of the drive unit 22 (see FIG. 2).

The pixel signal generation unit 32 generates a signal of a voltage corresponding to the photocurrent supplied from the light receiving unit 31 in the light receiving area 21b as a pixel signal SIG, and supplies the generated pixel signal SIG to the column processing unit 24 (see FIG. 2) via the vertical signal line VSL.

The address event detection unit 33 detects the presence or absence of an address event on the basis of whether or not the change amount of photocurrent from each of the light receiving unit 31 in the light receiving area 21b exceeds a predetermined threshold value. The address event (hereinafter, may be simply referred to as an "event") includes, for example, an on-event indicating that the change amount of the photocurrent exceeds the upper limit first threshold value and an off-event indicating that the change amount falls below the lower limit second threshold value. Furthermore, the detection signal of the address event includes, for example, one bit indicating the detection result of the on-event and one bit indicating the detection result of the off-event. Note that the address event detection unit 33 can be configured to detect only an on-event.

On the other hand, the address event detection unit 33 of the light shielding pixel detects the presence or absence of an address event on the basis of whether or not the change amount of current output from each of the light receiving unit 31 of the light shielding pixel exceeds a predetermined threshold value. The address event includes, for example, an on-event indicating that the change amount of the output current exceeds the upper limit first threshold value and an off-event indicating that the change amount falls below the lower limit second threshold value. Furthermore, the detection signal of the address event includes, for example, one bit indicating the detection result of the on-event and one bit indicating the detection result of the off-event. Note that the address event detection unit 33 can be configured to detect only an on-event or only an off-event.

When an address event occurs, the address event detection unit 33 in the light receiving area 21b supplies a request for requesting transmission of a detection signal of the address event to the arbiter unit 23 (see FIG. 2). Then, upon receiving a response to the request from the arbiter unit 23, the address event detection unit 33 supplies a detection signal of the address event to the drive unit 22 and the signal processing unit 25.

On the other hand, when an address event occurs, the address event detection unit 33 of the light shielding pixel supplies a detection signal of the address event to the counting unit 26a of the setting unit 26. Then, the counting unit 26a counts the number of the on-events and the off-events, and supplies the count number to the threshold value control unit 26b. With such a configuration, the address event detection unit 33 of the light shielding pixel can supply the detection signal including the event information to the setting unit 26 through a path different from the address event detection unit 33 in the light receiving area 21b.

[Circuit Configuration Example of Pixel]

Figure 4:
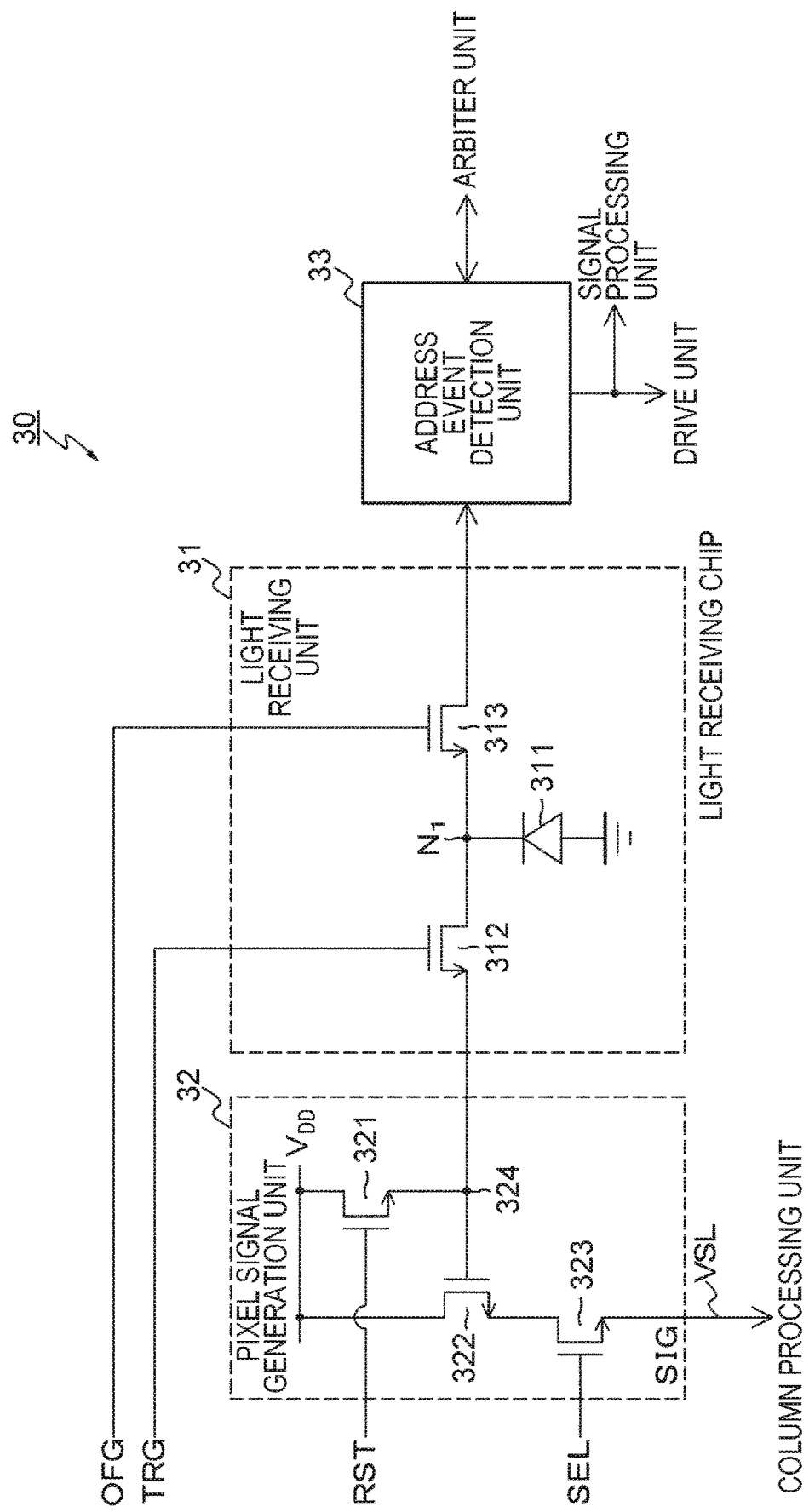
FIG. 4 is a circuit diagram illustrating an example of a circuit configuration of a pixel.

FIG. 4 is a circuit diagram illustrating an example of a circuit configuration of the pixel 30. As described above, each of the plurality of pixels 30 includes a light receiving unit 31, a pixel signal generation unit 32, and an address event detection unit 33.

In the pixel 30 having the above configuration, the light receiving unit 31 includes a light receiving element (photoelectric conversion element) 311, a transfer transistor 312, and an over flow gate (OFG) transistor 313. As the transfer transistor 312 and the OFG transistor 313, for example, an N-type metal oxide semiconductor (MOS) transistor is used. The transfer transistor 312 and the OFG transistor 313 are connected in series to each other.

The light receiving element 311 in the light receiving area 21b is connected between a common connection node $N_1$ of the transfer transistor 312 and the OFG transistor 313 and the ground, and photoelectrically converts the incident light to generate a charge of a charge amount corresponding to the amount of the incident light.

On the other hand, the light receiving element 311 of the light shielding pixel is connected between a common connection node $N_1$ of the transfer transistor 312 and the OFG transistor 313 and the ground, and generates a charge of a charge amount corresponding to the noise component. The transfer transistor 312 of the light receiving element 311 of the light shielding pixel is always in an OFF state, and the charge supply to the pixel signal generation unit 32 is stopped. For this reason, the light shielding pixel 30 does not have to include the transfer transistor 312 and the pixel signal generation unit 32.

A transfer signal TRG is supplied from the drive unit 22 illustrated in FIG. 2 to the gate electrode of the transfer transistor 312 in the light receiving area 21b. In response to the transfer signal TRG, the transfer transistor 312 supplies the charge photoelectrically converted by the light receiving element 311 to the pixel signal generation unit 32.

A control signal OFG is supplied from the drive unit 22 to the gate electrode of the OFG transistor 313. In response to the control signal OFG, the OFG transistor 313 supplies the electrical signal generated by the light receiving element 311 to the address event detection unit 33. The electrical signal supplied to the address event detection unit 33 is a photocurrent including charges.

The pixel signal generation unit 32 includes a reset transistor 321, an amplification transistor 322, a selection transistor 323, and a floating diffusion layer 324. As the reset transistor 321, the amplification transistor 322, and the selection transistor 323, for example, an N-type MOS transistor is used.

The charge photoelectrically converted by the light receiving element 311 is supplied from the light receiving unit 31 to the pixel signal generation unit 32 by the transfer transistor 312. The charge supplied from the light receiving unit 31 is accumulated in the floating diffusion layer 324. The floating diffusion layer 324 generates a voltage signal having a voltage value corresponding to the amount of accumulated charges. That is, the floating diffusion layer 324 converts electric charge into voltage.

The reset transistor 321 is connected between the power line of a power supply voltage $V_{DD}$ and the floating diffusion layer 324. A reset signal RST is supplied from the drive unit 22 to the gate electrode of the reset transistor 321. The reset transistor 321 initializes (resets) the charge amount of the floating diffusion layer 324 in response to the reset signal RST.

The amplification transistor 322 is connected in series with the selection transistor 323 between the power line of the power supply voltage $V_{DD}$ and the vertical signal line VSL. The amplification transistor 322 amplifies the voltage signal subjected to charge-voltage conversion by the floating diffusion layer 324.

A selection signal SEL is supplied from the drive unit 22 to the gate electrode of the selection transistor 323. In response to the selection signal SEL, the selection transistor 323 outputs the voltage signal amplified by the amplification transistor 322 to the column processing unit 24 (see FIG. 2) via the vertical signal line VSL as the pixel signal SIG.

In the imaging device 20 including the pixel array unit 21 in which the pixels 30 having the above-described configuration are two-dimensionally arranged, when the control unit 13 illustrated in FIG. 1 gives an instruction to start detection of an address event of the light receiving area 21b, the drive unit 22 supplies the control signal OFG to the OFG transistor 313 of the light receiving unit 31, driving the OFG transistor 313 to supply photocurrent to the address event detection unit 33.

On the other hand, when the control unit 13 illustrated in FIG. 1 gives an instruction to start detection of an address event of the light shielding pixel, the drive unit 22 supplies the control signal OFG to the OFG transistor 313 of the light receiving unit 31 of the light shielding pixel, driving the OFG transistor 313 to supply output current to the address event detection unit 33.

Then, when an address event is detected in the pixel 30 in the light receiving area 21b, the drive unit 22 turns off the OFG transistor 313 of the pixel 30 and stops the supply of photocurrent to the address event detection unit 33. Next, the drive unit 22 drives the transfer transistor 312 by supplying the transfer signal TRG to the transfer transistor 312, and transfers the charge photoelectrically converted by the light receiving element 311 to the floating diffusion layer 324.

In this manner, the imaging device 20 including the pixel array unit 21 in which the pixels 30 having the above-described configuration are two-dimensionally arranged outputs only the pixel signal of the pixel 30 in the light receiving area 21b in which the address event is detected to the column processing unit 24. On the other hand, the light shielding pixel 30 is only used for detecting an address event. Therefore, regardless of the presence or absence of an address event, the power consumption of the imaging device 20 and the processing amount of the image processing can be reduced as compared with the case of outputting the pixel signals of all the pixels.

Note that the configuration of the pixel 30 exemplified here is an example, and is not limited to this configuration example. For example, the pixel configuration does not have to not include the pixel signal generation unit 32. In the case of this pixel configuration, in the light receiving unit 31, it is only required to omit the OFG transistor 313 and cause the transfer transistor 312 to have the function of the OFG transistor 313.

[First Configuration Example of Address Event Detection Unit]

Figure 5:
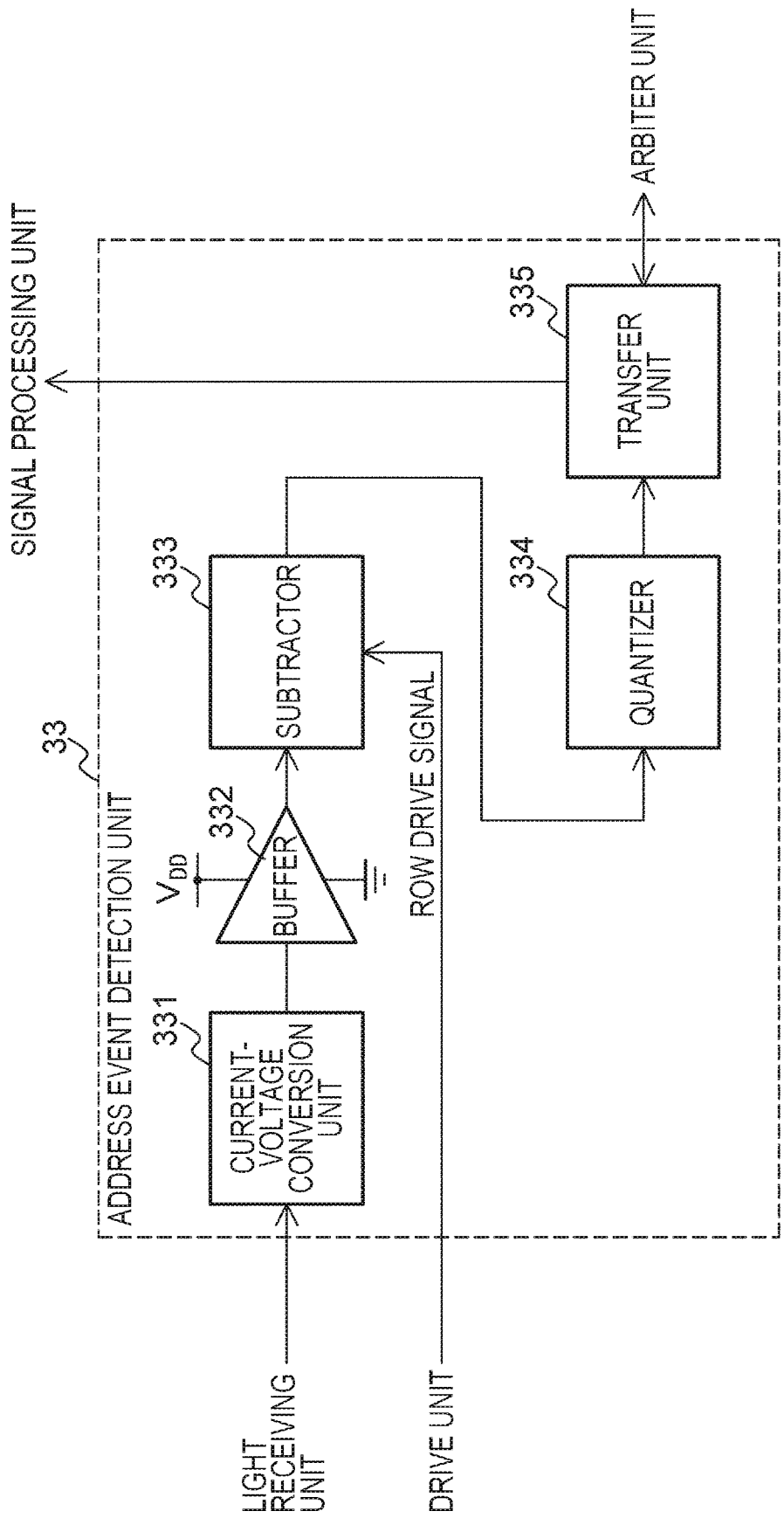
FIG. 5 is a block diagram illustrating the first configuration example of an address event detection unit.
Figure 6:
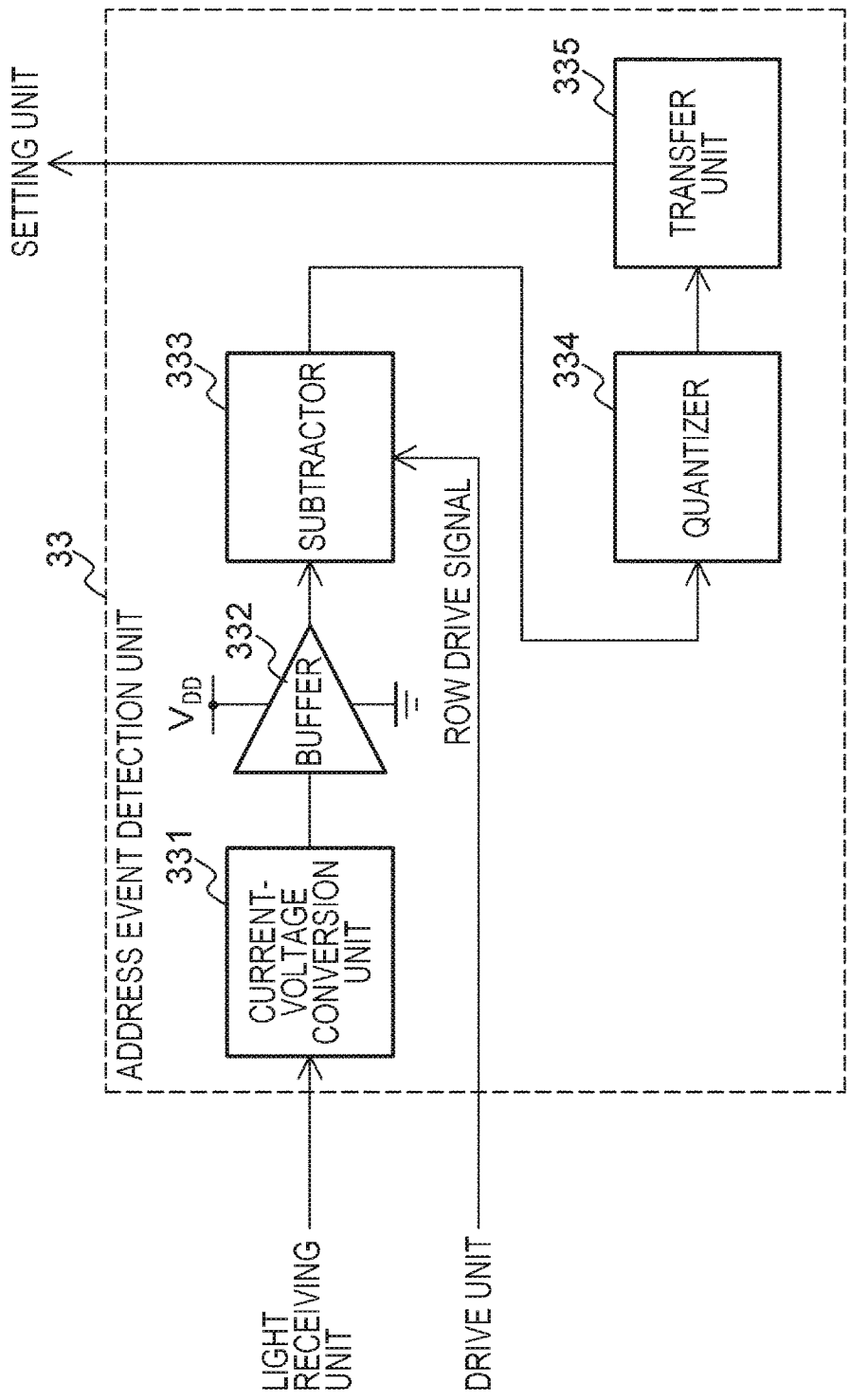
FIG. 6 is a block diagram illustrating the first configuration example of the address event detection unit of a light shielding pixel.

FIG. 5 is a block diagram illustrating the first configuration example of the address event detection unit 33 in the light receiving area 21b. FIG. 6 is a block diagram illustrating the first configuration example of the address event detection unit 33 of the light shielding pixel. As illustrated in FIGS. 5 and 6, the address event detection unit 33 according to the present configuration example includes a current-voltage conversion unit 331, a buffer 332, a subtractor 333, a quantizer 334, and a transfer unit 335.

The current-voltage conversion unit 331 converts the photocurrent from the light receiving unit 31 of the pixel 30 into a logarithmic voltage signal. The current-voltage conversion unit 331 supplies the converted voltage signal to the buffer 332. The buffer 332 buffers the voltage signal supplied from the current-voltage conversion unit 331 and supplies the voltage signal to the subtractor 333.

A row drive signal is supplied from the drive unit 22 to the subtractor 333. The subtractor 333 lowers the level of the voltage signal supplied from the buffer 332 in accordance with the row drive signal. Then, the subtractor 333 supplies the voltage signal after the level reduction to the quantizer 334. The quantizer 334 quantizes the voltage signal supplied from the subtractor 333 into a digital signal and outputs the digital signal to the transfer unit 335 as a detection signal of an address event.

As illustrated in FIG. 5, the transfer unit 335 of the light receiving area 21b transfers the detection signal of the address event supplied from the quantizer 334 to the arbiter unit 23 and the like. When an address event is detected, the transfer unit 335 supplies a request for requesting transmission of a detection signal of the address event to the arbiter unit 23. Then, upon receiving a response to the request from the arbiter unit 23, the transfer unit 335 supplies a detection signal of the address event to the drive unit 22 and the signal processing unit 25.

On the other hand, as illustrated in FIG. 6, the transfer unit 335 of the light shielding pixel transfers the detection signal of the address event supplied from the quantizer 334 to the setting unit 26.

Next, configuration examples of the current-voltage conversion unit 331, the subtractor 333, and the quantizer 334 in the address event detection unit 33 will be described.

(Configuration Example of Current-Voltage Conversion Unit)

Figure 7:
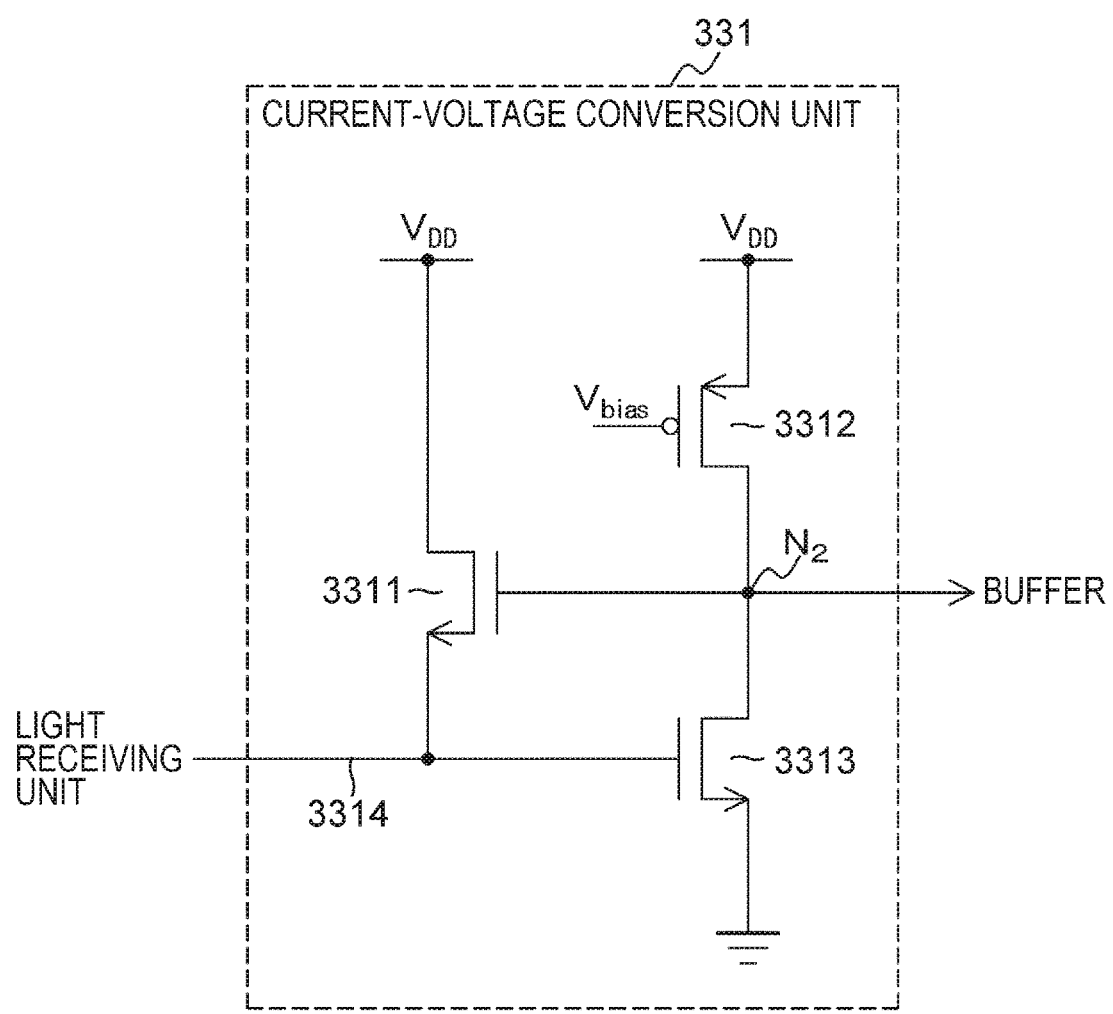
FIG. 7 is a circuit diagram illustrating an example of a configuration of a current-voltage conversion unit.

FIG. 7 is a circuit diagram illustrating an example of a configuration of the current-voltage conversion unit 331 in the address event detection unit 33. As illustrated in FIG. 7, the current-voltage conversion unit 331 according to the present example has a circuit configuration including an N-type transistor 3311, a P-type transistor 3312, and an N-type transistor 3313. As these transistors 3311 to 3313, for example, MOS transistors are used.

The N-type transistor 3311 is connected between the power line of the power supply voltage $V_{DD}$ and a signal input line 3314. The P-type transistor 3312 and the N-type transistor 3313 are connected in series between the power line of the power supply voltage $V_{DD}$ and the ground. Then, a common connection node $N_2$ of the P-type transistor 3312 and the N-type transistor 3313 is connected to the gate electrode of the N-type transistor 3311 and the input terminal of the buffer 332 illustrated in FIGS. 5 and 6.

A predetermined bias voltage $V_{bias}$ is applied to the gate electrode of the P-type transistor 3312. Therefore, the P-type transistor 3312 supplies a constant current to the N-type transistor 3313. A photocurrent is input from the light receiving unit 31 to the gate electrode of the N-type transistor 3313 through the signal input line 3314.

Drain electrodes of the N-type transistor 3311 and the N-type transistor 3313 are connected to a power supply side, and such a circuit is called a source follower. The photocurrent from the light receiving unit 31 is converted into a logarithmic voltage signal by the two source followers connected in a loop shape.

(Configuration Example of Subtractor and Quantizer)

Figure 8:
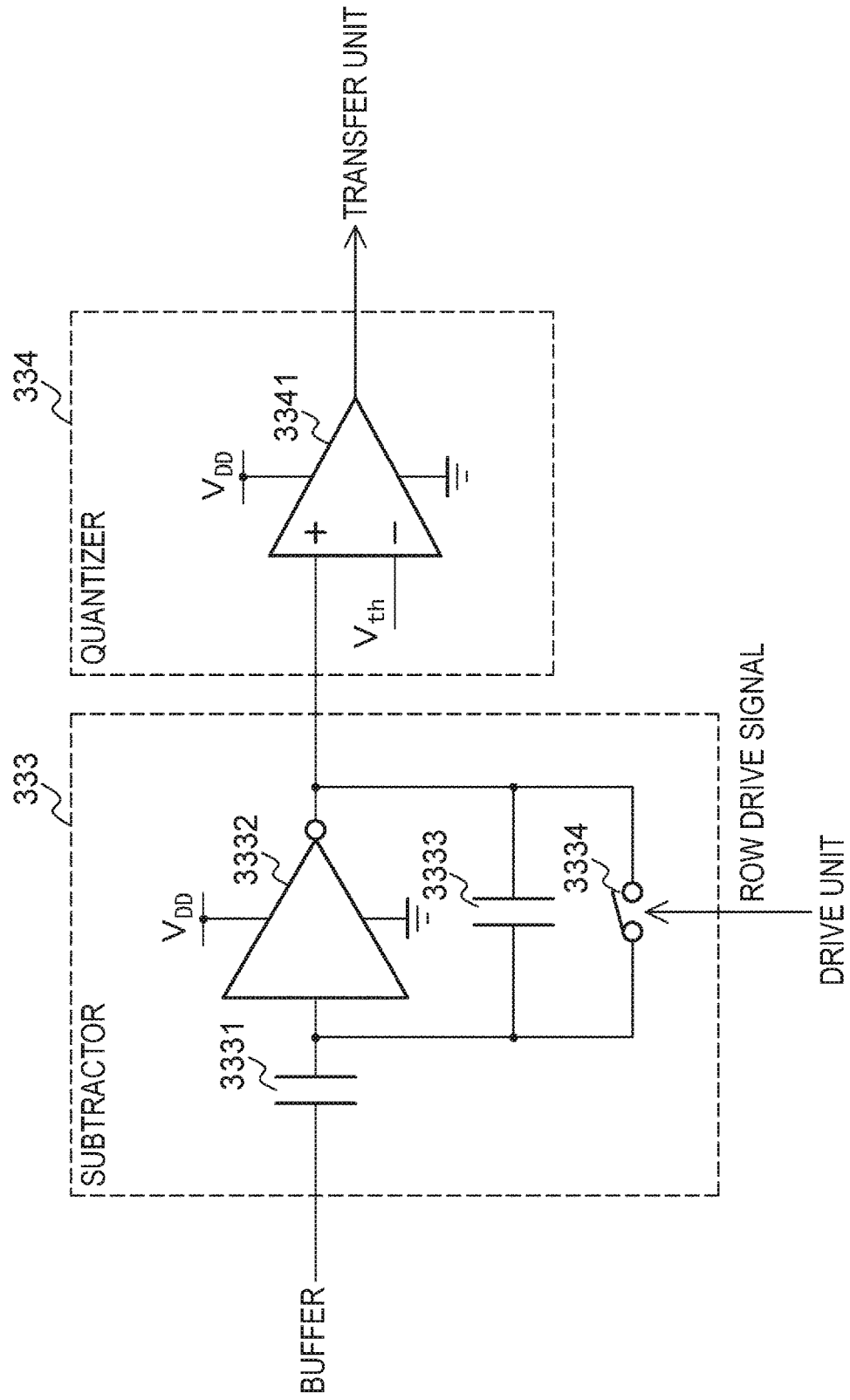
FIG. 8 is a circuit diagram illustrating an example of a configuration of a subtractor and a quantizer in the address event detection unit.

FIG. 8 is a circuit diagram illustrating an example of a configuration of the subtractor 333 and the quantizer 334 in the address event detection unit 33.

The subtractor 333 according to the present example includes a capacitive element 3331, an inverter circuit 3332, a capacitive element 3333, and a switch element 3334.

One end of the capacitive element 3331 is connected to the output terminal of the buffer 332 illustrated in FIGS. 5 and 6, and the other end thereof is connected to the input terminal of the inverter circuit 3332. The capacitive element 3333 is connected in parallel to the inverter circuit 3332. The switch element 3334 is connected between both ends of the capacitive element 3333. A row drive signal is supplied from the drive unit 22 to the switch element 3334 as the opening/closing control signal. The switch element 3334 opens and closes a path connecting both ends of the capacitive element 3333 according to the row drive signal. The inverter circuit 3332 inverts the polarity of the voltage signal input via the capacitive element 3331.

In the subtractor 333 having the above configuration, when the switch element 3334 is turned on (closed), a voltage signal $V_{init}$ is input to the terminal of the capacitive element 3331 on the side of the buffer 332, and the terminal on the opposite side becomes a virtual ground terminal. The potential of the virtual ground terminal is set to zero for convenience. At this time, when the capacitance value of the capacitive element 3331 is $C_1$, a charge $Q_{init}$ accumulated in the capacitive element 3331 is expressed by the following formula (1). On the other hand, since both ends of the capacitive element 3333 are short-circuited, the accumulated charge becomes 0.

$$Q_{init}=C_1 \times V_{init} \quad (1)$$

Next, considering a case where the switch element 3334 is turned off (opened) and the voltage of the terminal of the capacitive element 3331 on the side of the buffer 332 changes to $V_{after}$, a charge $Q_{after}$ accumulated in the capacitive element 3331 is expressed by the following formula (2).

$$Q_{after}=C_1 \times V_{after} \quad (2)$$

On the other hand, when the capacitance value of the capacitive element 3333 is $C_2$ and the output voltage is $V_{out}$, a charge $Q_2$ accumulated in the capacitive element 3333 is expressed by the following formula (3).

$$Q_2=-C_2 \times V_{out} \quad (3)$$

At this time, since the total charge amount of the capacitive element 3331 and the capacitive element 3333 does not change, the following formula (4) holds.

$$Q_{init}=Q_{after}+Q_2 \quad (4)$$

When the formulas (1) to (3) are substituted into the expression (4) and deformed, the following formula (5) is obtained.

$$V_{out}=(C_1/C_2) \times (V_{after}-V_{init}) \quad (5)$$

Formula (5) represents the subtraction operation of the voltage signal, and the gain of the subtraction result is $C_1/C_2$. Since it is usually desired to maximize the gain, it is preferable to design $C_1$ to be large and $C_2$ to be small. On the other hand, when $C_2$ is too small, kTC noise increases, and noise characteristics may deteriorate. Therefore, capacity reduction of $C_2$ is limited to a range in which noise can be tolerated. Furthermore, since the address event detection unit 33 including the subtractor 333 is mounted for each pixel 30, the capacitive element 3331 and the capacitive element 3333 have area restrictions. In consideration of these, the capacitance values $C_1$ and $C_2$ of the capacitive elements 3331 and 3333 are determined.

In FIG. 8, the quantizer 334 includes a comparator 3341. The comparator 3341 takes the output signal of the inverter circuit 3332, that is, the voltage signal from a subtractor 430 as a non-inverting (+) input, and takes a predetermined threshold value voltage $V_{th}$ as an inverting (−) input. Then, the comparator 3341 compares the voltage signal from the subtractor 430 with the predetermined threshold value voltage $V_{th}$, and outputs a signal indicating a comparison result to the transfer unit 335 as an address event detection signal.

[Second Configuration Example of Address Event Detection Unit]

Figure 9:
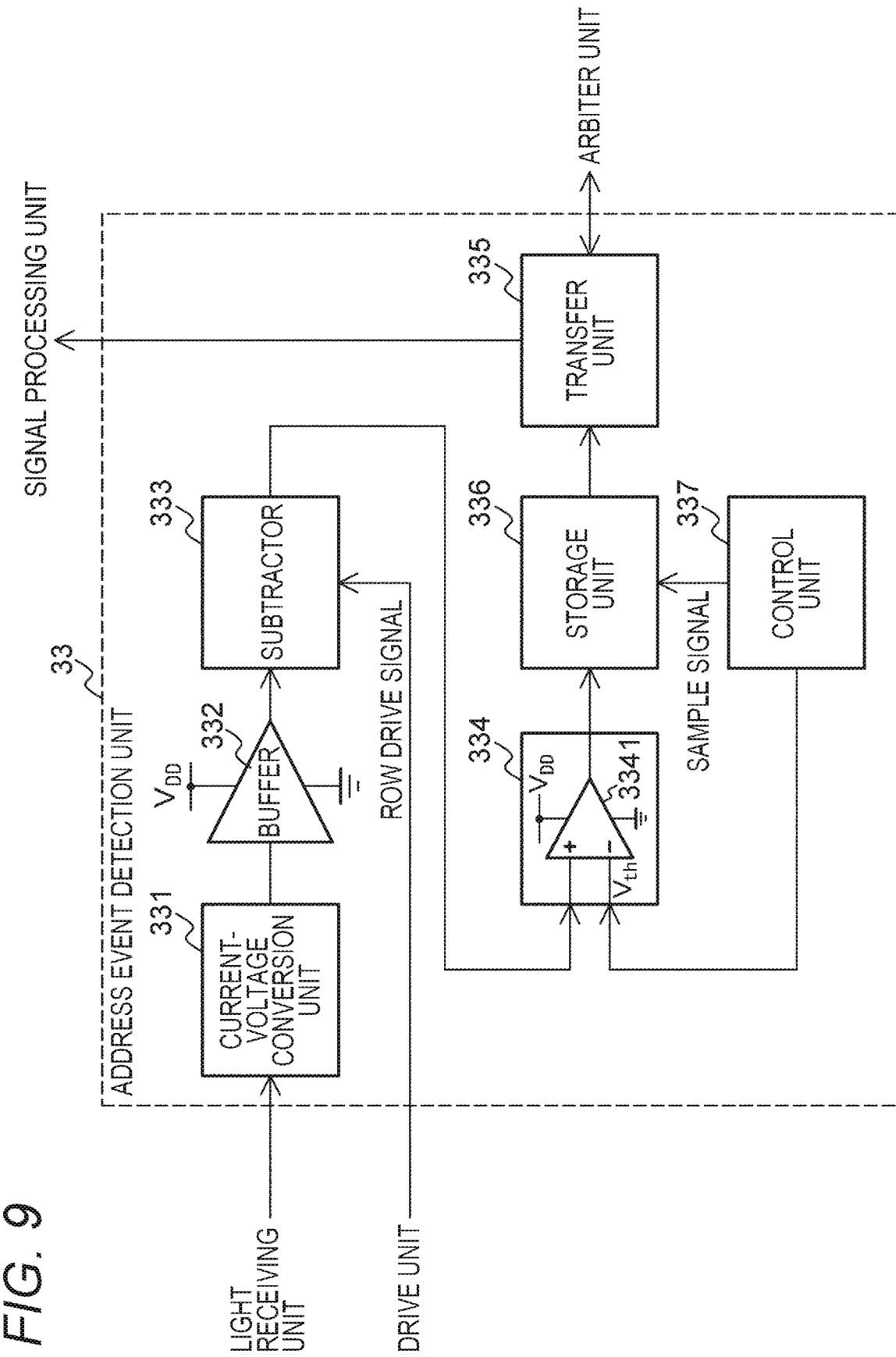
FIG. 9 is a block diagram illustrating a second configuration example of the address event detection unit.
Figure 10:
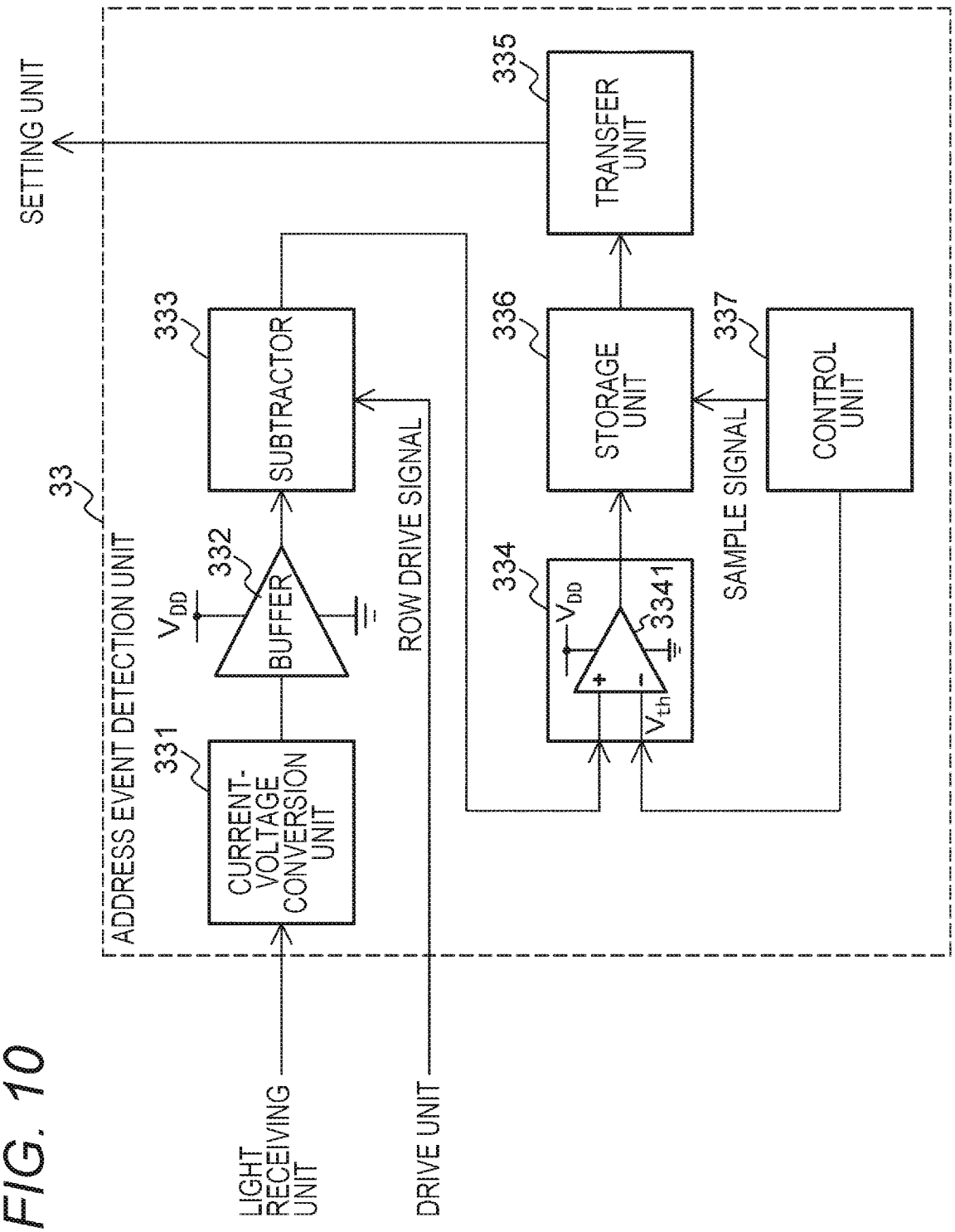
FIG. 10 is a block diagram illustrating the second configuration example of the address event detection unit of the light shielding pixel.

FIG. 9 is a block diagram illustrating the second configuration example of the address event detection unit 33 in the light receiving area 21b. FIG. 10 is a block diagram illustrating the second configuration example of the address event detection unit 33 of the light shielding pixel. As illustrated in FIGS. 9 and 10, the address event detection unit 33 according to the present configuration example includes a storage unit 336 and a control unit 337 in addition to the current-voltage conversion unit 331, the buffer 332, the subtractor 333, the quantizer 334, and the transfer unit 335.

The storage unit 336 is provided between the quantizer 334 and the transfer unit 335, and accumulates the output of the quantizer 334, that is, the comparison result of the comparator 3341 on the basis of the sample signal supplied from the control unit 337. The storage unit 336 may be a sampling circuit such as a switch, plastic, or a capacitor, or may be a digital memory circuit such as a latch or a flip-flop.

The control unit 337 supplies a predetermined threshold value voltage $V_{th}$ to the inverting (−) input terminal of the comparator 3341 in accordance with a control signal of the threshold value control unit 26b of the setting unit 26. The threshold value voltage $V_{th}$ supplied from the control unit 337 to the comparator 3341 may have different voltage values in a time division manner. For example, the control unit 337 supplies a threshold value voltage $V_{th1}$ corresponding to the on-event indicating that the change amount of the photocurrent exceeds the upper limit threshold value and the threshold value voltage $V_{th2}$ corresponding to the off-event indicating that the change amount falls below the lower limit threshold value at different timings, in a manner that one comparator 3341 can detect a plurality of types of address events.

For example, the storage unit 336 may accumulate the comparison result of the comparator 3341 using the threshold value voltage $V_{th1}$ corresponding to the on-event in a period in which the threshold value voltage $V_{th2}$ corresponding to the off-event is supplied from the control unit 337 to the inverting (−) input terminal of the comparator 3341. Note that the storage unit 336 may be inside the pixel 30 or may be outside the pixel 30. Furthermore, the storage unit 336 is not an essential component of the address event detection unit 33. That is, the storage unit 336 may be omitted.

[Imaging Device According to Second Configuration Example (Scanning Type)]

The imaging device 20 according to the first configuration example described above is an asynchronous imaging device that reads an event by an asynchronous reading method. However, the event reading method is not limited to the asynchronous reading method, and may be a synchronous reading method. The imaging device to which the synchronous reading method is applied is a scanning type imaging device, which is the same as a normal imaging device that performs imaging at a predetermined frame rate.

Figure 11:
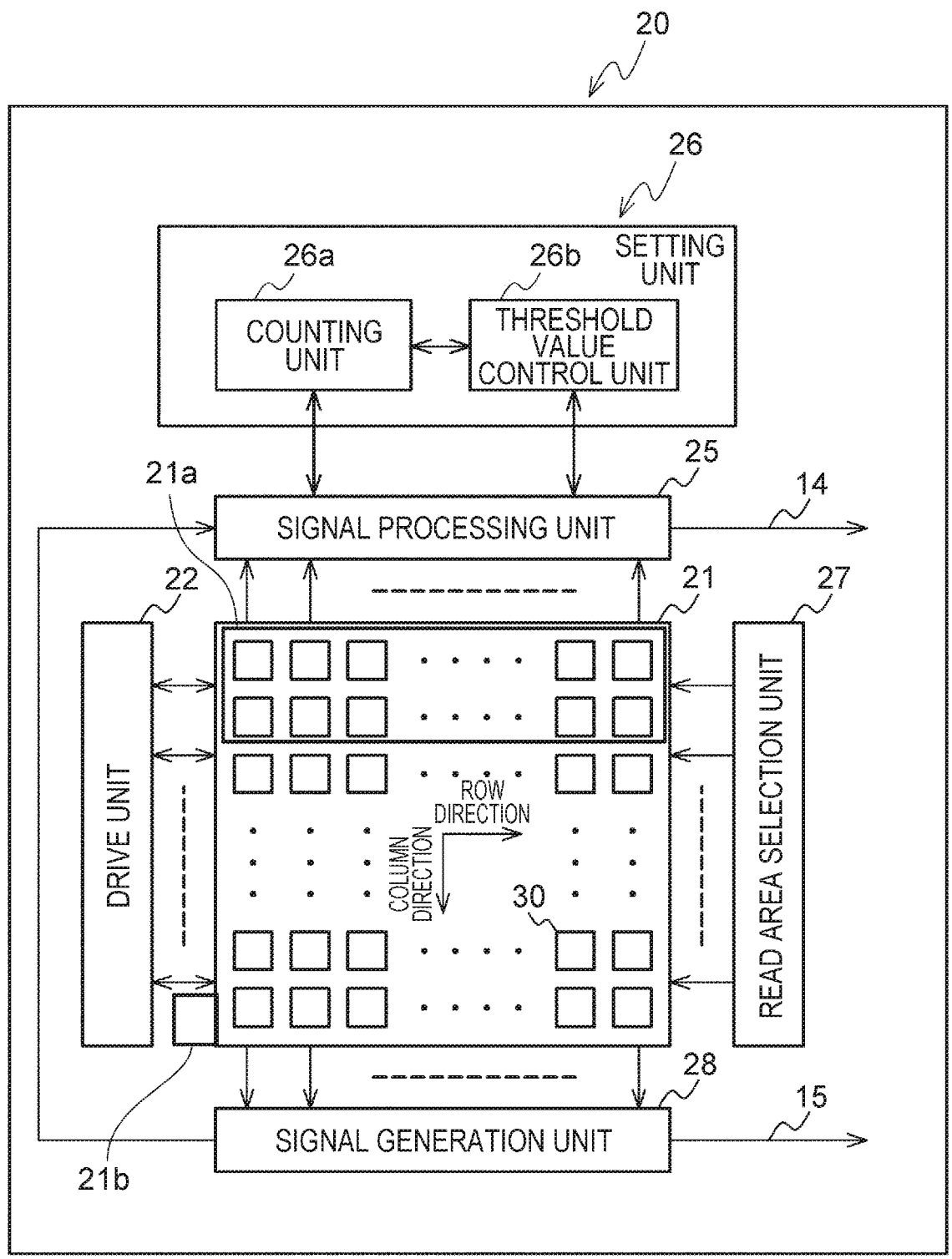
FIG. 11 is a block diagram illustrating an example of a configuration of an imaging device according to the second configuration example of the present disclosure.

FIG. 11 is a block diagram illustrating an example of a configuration of an imaging device according to a second configuration example, that is, a scanning type imaging device used as the imaging device 20 in the imaging system 10 to which the technology according to the present disclosure is applied.

As illustrated in FIG. 11, the imaging device 20 according to the second configuration example as the imaging device of the present disclosure includes the pixel array unit 21, the drive unit 22, the signal processing unit 25, the setting unit 26, a read area selection unit 27, and a signal generation unit 28.

The pixel array unit 21 includes the plurality of pixels 30. The plurality of pixels 30 outputs an output signal in response to the selection signal of the read area selection unit 27. Each of the plurality of pixels 30 may have a quantizer in the pixel as illustrated in FIG. 6, for example. The plurality of pixels 30 outputs an output signal corresponding to the change amount in the intensity of light. The plurality of pixels 30 may be two-dimensionally arranged in a matrix as illustrated in FIG. 11.

Furthermore, similarly to FIG. 2, the pixel array unit 21 is provided with the light shielding area 21a that shields light, and the light receiving area 21b other than the light shielding area 21a. The light shielding area 21a corresponds to at least one of the arrangement of the plurality of pixels 30 in units of rows or the arrangement of the plurality of pixels 30 in units of columns. Furthermore, the light shielding area 21a is provided in at least one of the upper end portion, the lower end portion, the left end portion, or the right end portion of the pixel array unit 21. As described above, the light shielding area 21a is provided to cover the plurality of pixels 30 at the end portion of the pixel array unit 21. The configuration of the pixel 30 in the light shielding area 21a is the same as that of the pixel 30 other than the light receiving area 21b, except that light is not incident. Therefore, the plurality of pixels 30 in the light shielding area 21a detects the presence or absence of an address event on the basis of whether or not the change amount of current due to noise exceeds a predetermined threshold value.

The drive unit 22 drives each of the plurality of pixels 30 to output the pixel signal generated in each pixel 30 to the signal processing unit 25. Note that the drive unit 22 and the signal processing unit 25 are circuit units for acquiring gradation information. Therefore, in a case where only the event information is acquired, the drive unit 22 and the signal processing unit 25 do not have to be provided.

The read area selection unit 27 selects some of the plurality of pixels 30 included in the pixel array unit 21. For example, the read area selection unit 27 selects any one or a plurality of rows among the rows included in the structure of the two-dimensional matrix corresponding to the pixel array unit 21. The read area selection unit 27 sequentially selects one or a plurality of rows according to a preset cycle. Furthermore, the read area selection unit 27 may determine the selection area in response to a request from each pixel 30 of the pixel array unit 21.

On the basis of the output signal of the pixel selected by the read area selection unit 27, the signal generation unit 28 generates an event signal corresponding to the active pixel in which the event has been detected among the selected pixels. The event is an event in which the intensity of light changes. The active pixel is a pixel in which the change amount in the intensity of light corresponding to the output signal exceeds or falls below a preset first threshold value or second threshold value. For example, the signal generation unit 28 detects a first detection signal when the absolute value of the change amount in the direction in which the signal level of the electrical signal increases exceeds the first threshold value, and detects a second detection signal when the absolute value of the change amount in the direction in which the signal level of the electrical signal decreases exceeds the second threshold value. Then, the pixel in which the first detection signal or the second detection signal is detected is set as an active pixel, and an event signal corresponding to the active pixel is generated.

The signal generation unit 28 can include, for example, a column selection circuit that arbitrates a signal entering the signal generation unit 28. Furthermore, the signal generation unit 28 can be configured to output not only the information of the active pixel that has detected the event but also the information of the inactive pixel that has not detected the event.

The address information and the time stamp information (for example, (X, Y, Ton) and (X, Y, Toff) of the active pixel in which the event has been detected are output from the signal generation unit 28 through an output line 15. However, the data output from the signal generation unit 28 may be not only the address information and the time stamp information but also information in a frame format (for example, (0, 0, 1, 0, . . . )). Ton indicates a time at which an on-event is detected, and Toff indicates a time at which an off-event is detected.

The counting unit 26a of the setting unit 26 counts the number the on-events and the off-events within a predetermined period using the address information and the time stamp information (for example, (X, Y, Ton) and (X, Y, Toff) of the active pixel, and supplies the count number to the threshold value control unit 26b. The counting unit 29a may count one of the on-event and the off-event and supply the count number to the threshold value control unit 26b.

[Configuration Example of Chip Structure]

Figure 12:
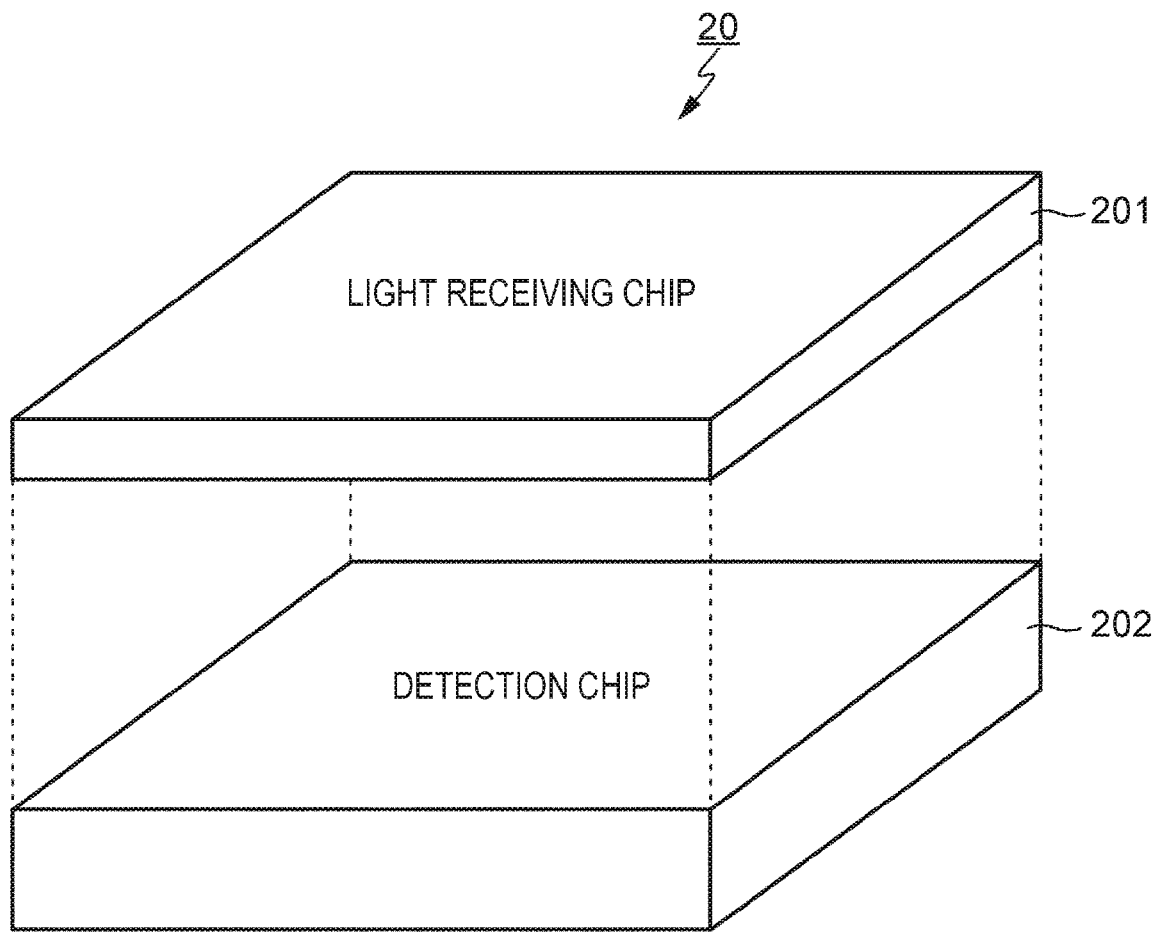
FIG. 12 is an exploded perspective diagram schematically illustrating a laminated chip structure of the imaging device.

As a chip (semiconductor integrated circuit) structure of the imaging device 20 according to the first configuration example or the second configuration example described above, for example, a laminated chip structure can be adopted. FIG. 12 is an exploded perspective diagram schematically illustrating a laminated chip structure of the imaging device 20.

As illustrated in FIG. 12, the laminated chip structure, that is, the laminated structure has a structure in which at least two chips of a light receiving chip 201 as a first chip and a detection chip 202 as a second chip are laminated. Then, in the circuit configuration of the pixel 30 illustrated in FIG. 4, each of the light receiving element 311 is arranged on the light receiving chip 201, and all elements other than the light receiving element 311, elements of other circuit portions of the pixel 30, and the like are arranged on the detection chip 202. The light receiving chip 201 and the detection chip 202 are electrically connected via a connection portion such as a via (VIA), Cu—Cu bonding, or a bump.

Note that, here, a configuration example in which the light receiving element 311 is arranged on the light receiving chip 201, and elements other than the light receiving element 311, elements of other circuit portions of the pixel 30, and the like are arranged on the detection chip 202 has been exemplified, but the present technology is not limited to this configuration example.

For example, in the circuit configuration of the pixel 30 illustrated in FIG. 4, each element of the light receiving unit 31 may be arranged on the light receiving chip 201, and elements other than the light receiving unit 31, elements of other circuit portions of the pixel 30, and the like may be arranged on the detection chip 202. Furthermore, each element of the light receiving unit 31, and the reset transistor 321 and the floating diffusion layer 324 of the pixel signal generation unit 32 may be arranged on the light receiving chip 201, and the other elements may be arranged on the detection chip 202. Furthermore, a part of the elements constituting the address event detection unit 33 may be arranged on the light receiving chip 201 together with each element of the light receiving unit 31 and the like.

[Configuration Example pf Column Processing Unit]

Figure 13:
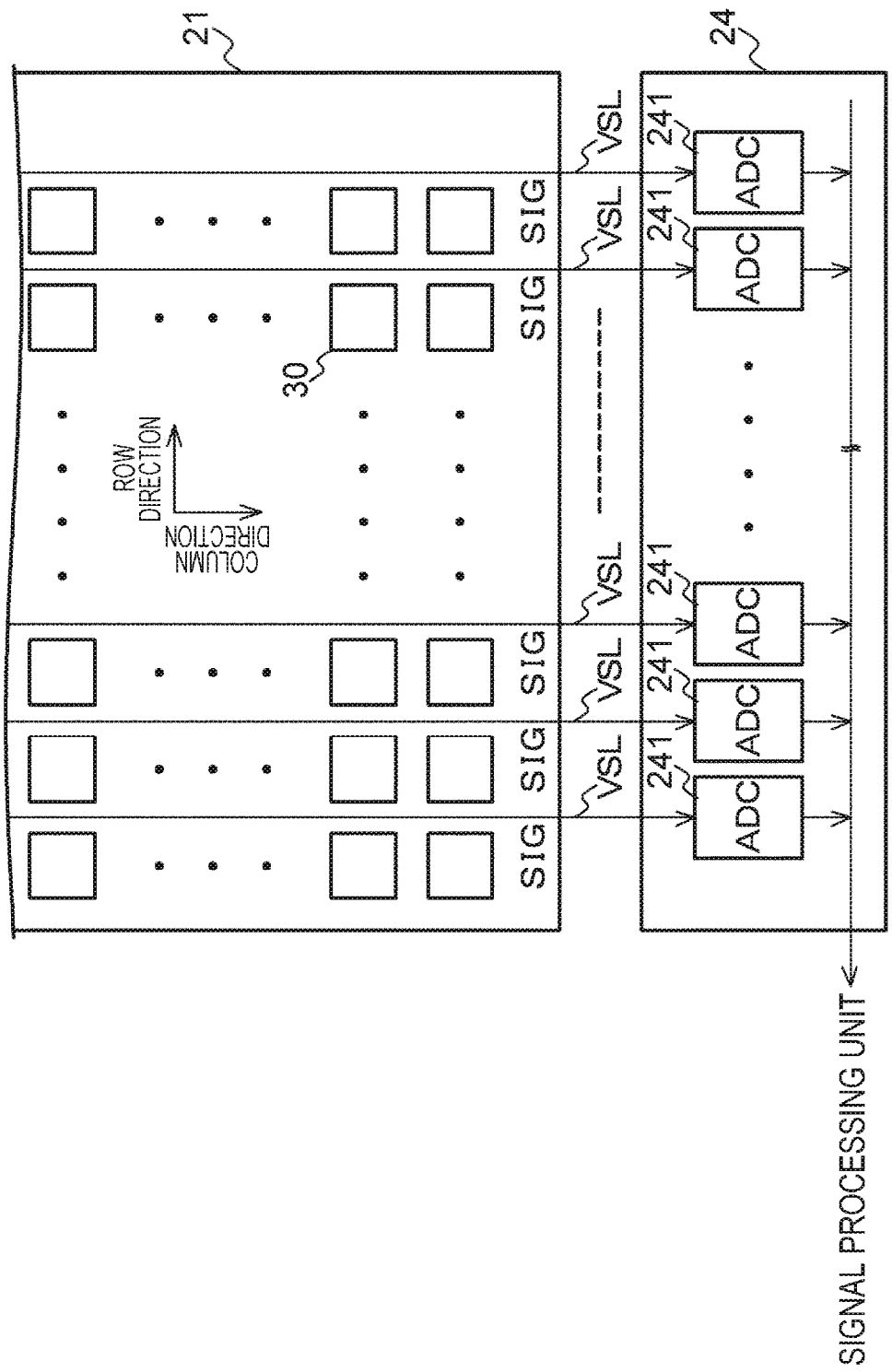
FIG. 13 is a block diagram illustrating an example of a configuration of a column processing unit of the imaging device according to the first configuration example.

FIG. 13 is a block diagram illustrating an example of a configuration of the column processing unit 24 of the imaging device 20 according to the first configuration example. As illustrated in FIG. 13, the column processing unit 24 according to the present example includes a plurality of analog-digital converters (ADC) 241 arranged for each pixel column of the pixel array unit 21.

Note that, here, a configuration example in which the analog-digital converter 241 is arranged in a one-to-one correspondence relationship with respect to the pixel column of the pixel array unit 21 has been exemplified, but the present technology is not limited to this configuration example. For example, the analog-digital converter 241 may be arranged in units of a plurality of pixel columns, and the analog-digital converter 241 may be used in a time division manner between the plurality of pixel columns.

The analog-digital converter 241 converts the analog pixel signal SIG supplied via the vertical signal line VSL into a digital signal having a larger bit depth than the detection signal of the address event described above. For example, when the detection signal of the address event is 2 bits, the pixel signal is converted into a digital signal of 3 bits or more (16 bits and the like). The analog-digital converter 241 supplies the digital signal generated by the analog-digital conversion to the signal processing unit 25.

[Noise Event]

By the way, the imaging device 20 is an imaging device including, for each pixel 30, a detection unit (that is, the address event detection unit 33) that detects, for each pixel address, in real time, that the light amount of the pixel has exceeded a predetermined threshold value, as an address event.

In this imaging device, when a certain event (that is, a true event) originally occurs in a scene, data that causes the occurrence of the true event is acquired. However, even in a scene in which no true event occurs, data may be wastefully acquired due to a noise event (false event) such as sensor noise. Therefore, not only the noise signal is read, but also the throughput of the signal output is reduced. The imaging device 20 of the present disclosure described below performs sensitivity adjustment for a true event and a false event on the basis of the number of events in the light shielding pixel.

Figure 14:
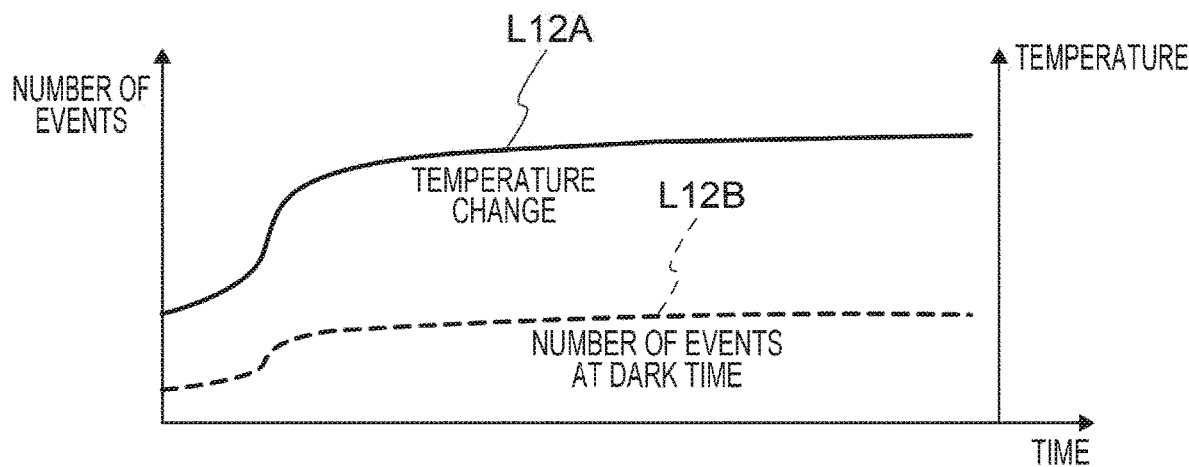
FIG. 14 is a schematic diagram illustrating a relationship between a noise event and temperature.

FIG. 14 is a schematic diagram illustrating a relationship between a noise event and temperature. The horizontal axis indicates time, and the vertical axis indicates the number of events and temperature. A line L12A indicates a temporal change in temperature, and a line L12B indicates a temporal change in the number of events at dark time which is a noise event in at dark time (when light is shielded). The pixel 30 outputs a dark time current by performing photoelectric conversion even in at dark time. This is counted as a dark time event.

As illustrated in FIG. 14, the time series change in the number of events at dark time correlates with, for example, the time series change in temperature. For example, lowering the sensitivity to a noise event reduces the noise event, but also reduces the detection sensitivity for a true event. On the other hand, when the detection sensitivity for a true event is increased, the sensitivity to a noise event also increases.

For this reason, the threshold value control unit 26b adjusts sensitivity to a true event and sensitivity to a false event caused by dark time noise by performing sensitivity adjustment according to the state of the imaging device 20. This will be described in more detail below.

Figure 15:
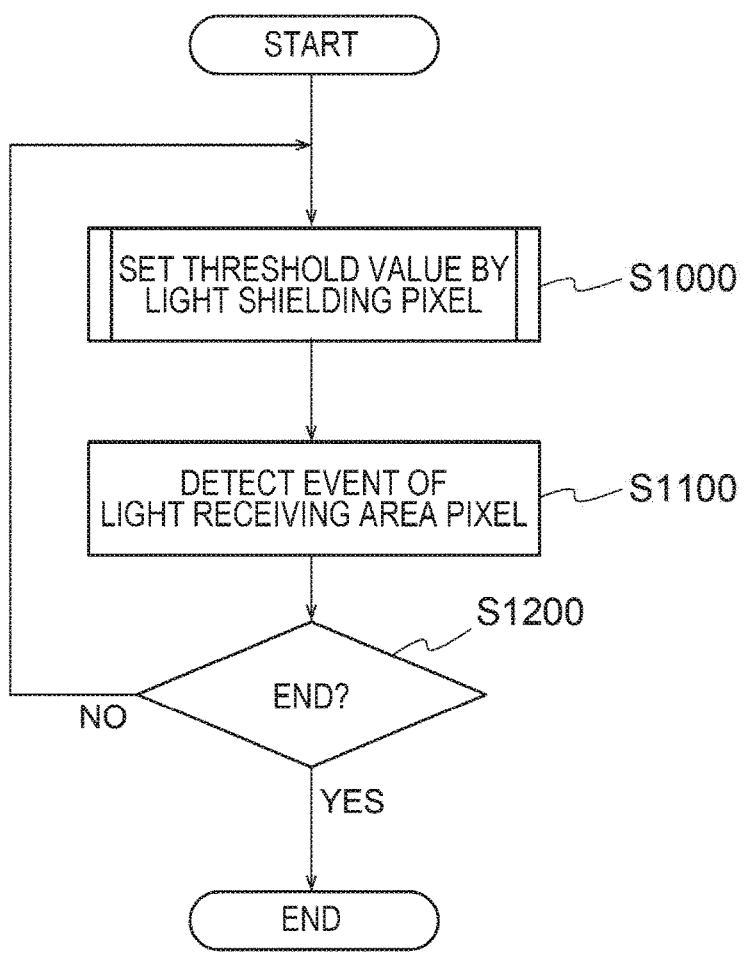
FIG. 15 is a flowchart illustrating a processing example of a threshold value control unit.

FIG. 15 is a flowchart illustrating a processing example of the threshold value control unit 26b of the setting unit 26. Here, an example of detecting an event by the pixel 30 in the light receiving area 21b after sensitivity adjustment using the light shielding pixel 30 in the light shielding area 21a will be described. As described above, the method of reading the detection signal of the event is different between the imaging device according to the asynchronous first configuration example and the imaging device (scanning type) according to the second configuration example, but the method of setting the threshold value of the imaging device according to the asynchronous first configuration example and the method of setting the threshold value of the imaging device (scanning type) according to the second configuration example can perform equivalent processing.

As illustrated in FIG. 15, first, the threshold value control unit 26b sets the threshold value according to the noise level of the light shielding pixel 30 in the light shielding area 21a (step S1000).

Next, the address event detection unit 33 in the light receiving area 21b detects the detection signal in a case where the change amount of the electrical signal generated in the pixel 30 in the light receiving area 21b exceeds the threshold value set in the threshold value control unit 26b (step S1100).

Next, the threshold value control unit 26b determines whether or not to end the entire processing (step S1200), and if not (NO in step S1200), repeats the processing from step S102. On the other hand, in a case where the processing is ended (YES in step S1200), the entire processing is ended.

As described above, since the threshold value control unit 26b sets the threshold value according to the noise level of the light shielding pixel 30 in the light shielding area 21a, sensitivity adjustment for the true event and the dark time noise event can be performed.

Figure 16:
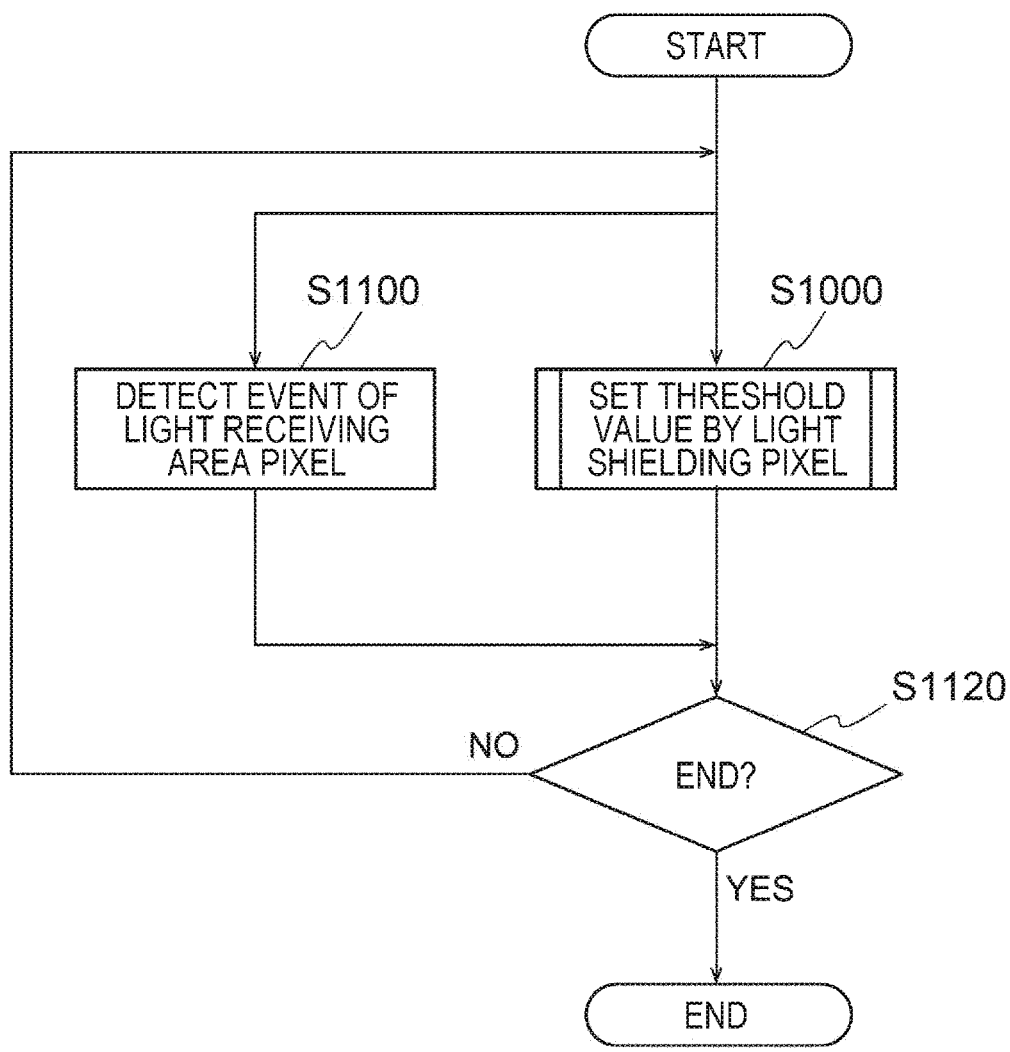
FIG. 16 is a flowchart illustrating a processing example of the threshold value control unit in parallel processing.

FIG. 16 is a flowchart illustrating a processing example of the threshold value control unit 26b in parallel processing. As illustrated in FIG. 16, the setting of the threshold value corresponding to the noise level of the light shielding pixel 30 (step S1000) and the detection processing of the address event detection unit 33 in the light receiving area 21b (step S1100) are performed in parallel.

As described above, by performing the processing in parallel, sensitivity adjustment for the true event and the dark time noise event can be performed without stopping the event detection of the address event detection unit 33 in the light receiving area 21b.

Figure 17:
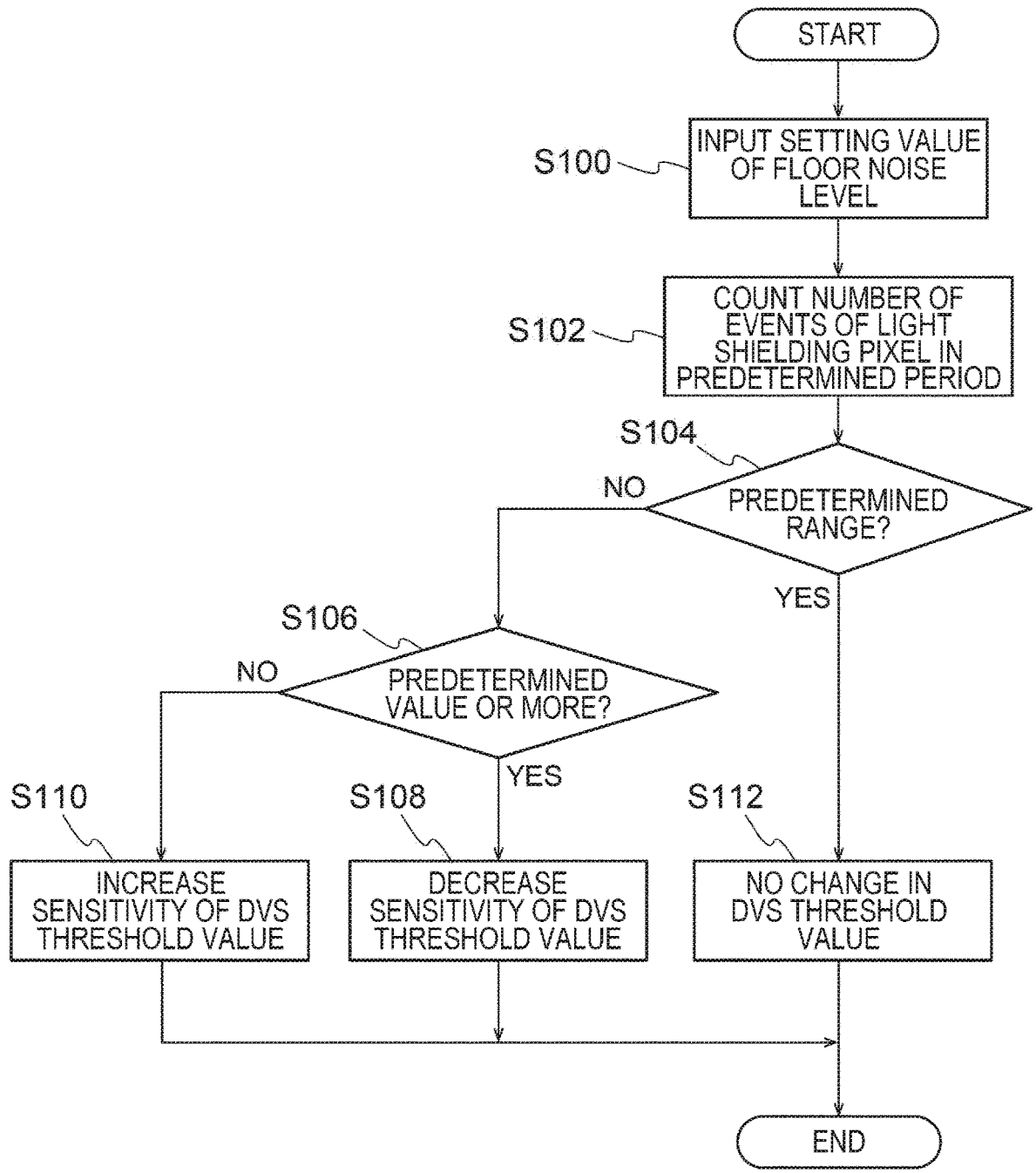
FIG. 17 is a flowchart illustrating a processing example of step S1000 in FIGS. 15 and 16.

FIG. 17 is a flowchart illustrating a processing example of step S1000 in FIGS. 15 and 16.

Figure 18:
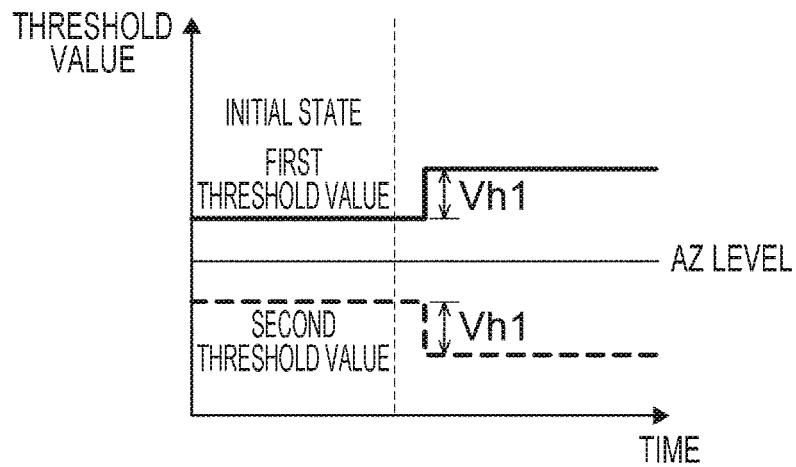
FIG. 18 is a diagram schematically illustrating a processing example illustrated in FIG. 17.

FIG. 18 is a diagram schematically illustrating a processing example illustrated in FIG. 17. The horizontal axis indicates time, and the vertical axis indicates a threshold value. As illustrated in FIG. 18, change amounts of the first threshold value for the on-event and the second threshold value for the off-event with respect to the reference level (AZ level) are schematically illustrated. Here, the absolute values of the change amounts of the first threshold value for the on-event and the second threshold value for the off-event with respect to the reference level (AZ level) are treated as the same value. For example, in a case where the first threshold value is increased by Vh1 volts from the initial setting value, the second threshold value is decreased by Vh1 volts from the initial setting value.

As illustrated in FIG. 17, the threshold value control unit 26b supplies the first threshold value voltage $V_{th1}$ and the second threshold value voltage $V_{th2}$ to the inverting (−) input terminal of the comparator 3341 (see FIGS. 8 and 10) of the light shielding pixel 30 and the light receiving area 21b (step S100). The comparator 3341 outputs, to the counting unit 26a of the setting unit 26, an event detection signal corresponding to an on-event indicating that the change amount in current exceeds the upper limit of the first threshold value voltage $V_{th1}$ upward and an event detection signal corresponding to an off-event indicating that the change amount in current exceeds the second threshold value voltage $V_{th2}$ downward. The counting unit 26a counts the number of events occurring within a predetermined period and supplies the number to the threshold value control unit 26b (step S102).

Note that, in the case of the parallel processing illustrated in FIG. 16, a predetermined period in step S102 illustrated in FIG. 17 does not need to be the entire imaging period, and a predetermined period for counting the number of events of the light shielding pixels and a period for not counting the number of events of the light shielding pixel may be alternately provided.

In the case of the imaging device (scanning type) according to the second configuration example, the read area selection unit 27 selects some of the plurality of pixels 30 included in the light shielding area 21a. For example, the read area selection unit 27 selects any one or a plurality of rows among the rows included in the structure of the two-dimensional matrix corresponding to the light shielding area 21a. The read area selection unit 27 (see FIG. 11) sequentially selects one or a plurality of rows according to a preset cycle, sequentially reads the address information and the time stamp information (for example, (X, Y, Ton) and (X, Y, Toff)) of the active pixel of the light shielding pixel 30, and supplies the read information to the counting unit 26a via the signal generation unit 28. The counting unit 26a of the setting unit 26 counts the number the on-events and the off-events within a predetermined period using the address information and the time stamp information ((for example, (X, Y, Ton) and (X, Y, Toff)) of the active pixel, and supplies the count number to the threshold value control unit 26b.

Next, the threshold value control unit 26b determines whether or not the count number of events (the number of on-events+the number of off-events) within a predetermined time falls within a predetermined range (step S104). In a case where the number of events is out of a predetermined range (YES in step S104), the threshold value control unit 26b further determines whether or not the count number of events is equal to or more than a predetermined value (step S106). In a case where the number of events is a predetermined value or more (YES in step S106), the threshold value control unit 26b decreases the sensitivity of the threshold value (step S108). That is, the threshold value control unit 26b increases the first threshold value voltage $V_{th1}$ by a predetermined value Th1a volt and decreases the second threshold value voltage $V_{th2}$ by the predetermined value Th1a volt with respect to the pixels 30 of the entire pixel array unit 21.

On the other hand, in a case where the number of events is less than a predetermined value (NO in step S106), the sensitivity of the threshold value is increased. The threshold value control unit 26b decreases the first threshold value voltage $V_{th1}$ by a predetermined value Th2a volt and increases the second threshold value voltage $V_{th2}$ by the predetermined value Th2a volt with respect to the pixels 30 of the entire pixel array unit 21 (step S110).

On the other hand, in a case where the number of events is less than a predetermined value (NO in step S104), the sensitivity of the threshold value is maintained. That is, the threshold value control unit 26b does not change the first threshold value voltage $V_{th1}$ and the second threshold value voltage $V_{th2}$ for the pixels 30 of the entire pixel array unit 21 (step S112).

Figure 19:
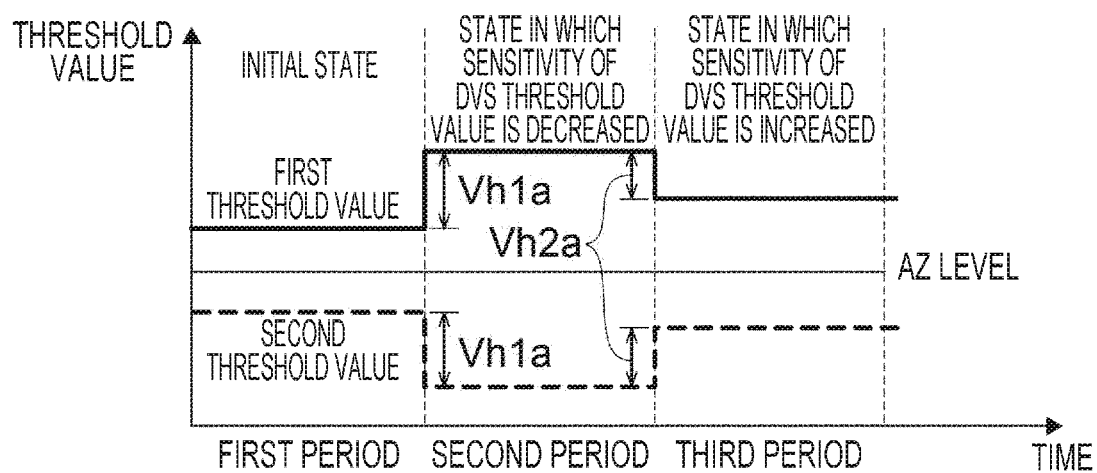
FIG. 19 is a diagram illustrating a processing example in which the processing illustrated in FIG. 17 is performed for three cycles.

FIG. 19 is a diagram illustrating a processing example in which the processing illustrated in FIG. 17 is performed for three cycles. The horizontal axis indicates time, and the vertical axis indicates a threshold value. As illustrated in FIG. 19, the first threshold value for the on-event and the second threshold value for the off-event can be varied with time.

As described above, the threshold value (the first threshold value voltage $V_{th1}$ or the second threshold value voltage $V_{th2}$) is set on the basis of the number of times the absolute value of the change amount from the reference level of the electrical signal generated by a photoelectric conversion element 311 in the shielding area 21a exceeds the threshold value (the first threshold value voltage $V_{th1}$ or the second threshold value voltage $V_{th2}$) in a predetermined period. Therefore, threshold value control can be performed according to the number of occurrences of dark time noise events in the light shielding pixel 30 in the light shielding area 21a, and sensitivity adjustment for the true event and the dark time noise event can be performed.

Figure 20:
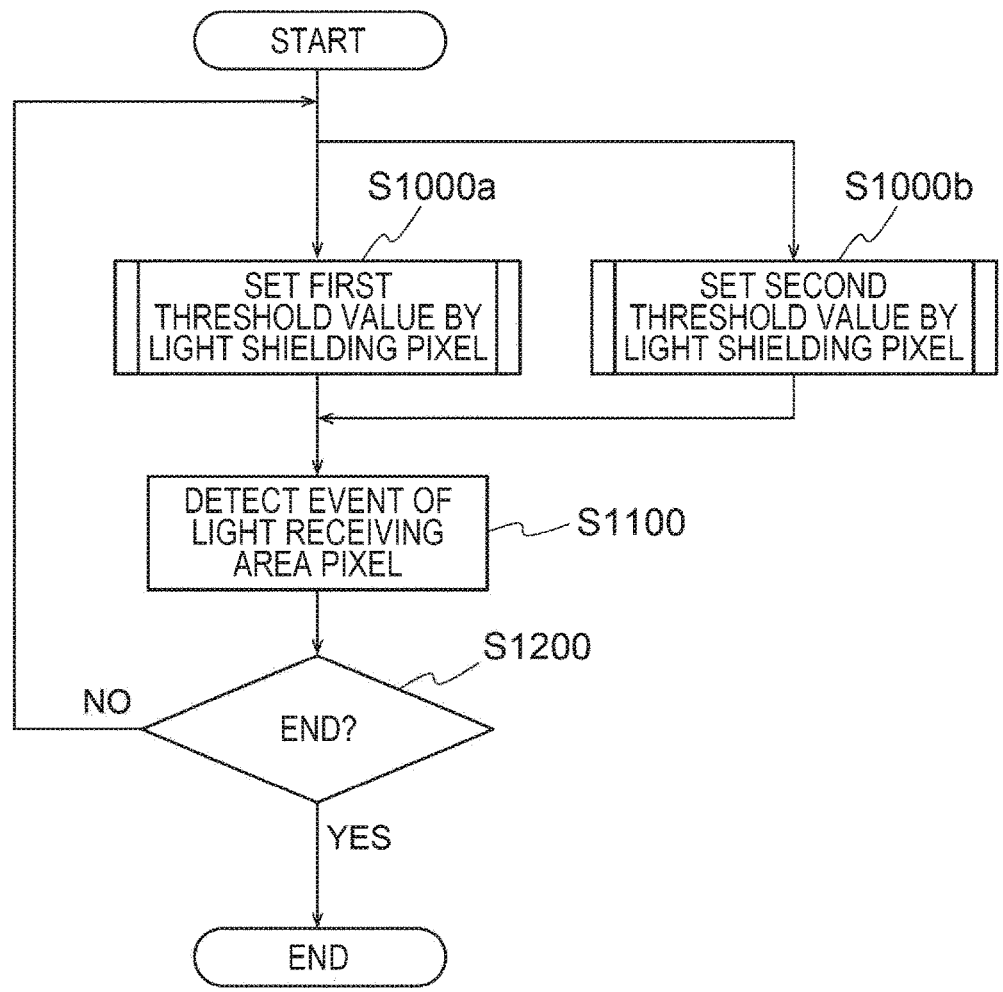
FIG. 20 is a flowchart illustrating a processing example in which a first threshold value and a second threshold value are independently adjusted.

FIG. 20 is a flowchart illustrating a processing example in which the first threshold value for the on-event and the second threshold value for the off-event are independently adjusted. As illustrated in FIG. 20, first, the threshold value control unit 26b sets the first threshold value according to the on-event of the light shielding pixel 30 in the light shielding area 21a (step S1000a), and in parallel, sets the second threshold value according to the level of the off-event of the light shielding pixel 30 in the light shielding area 21a (step S1000b).

Next, the address event detection unit 33 in the light receiving area 21b detects the detection signal of the on-event and the detection signal of the off-event in a case where the change amount of the electrical signal generated in the pixel 30 in the light receiving area 21b exceeds the first threshold value and the second threshold value independently set in the threshold value control unit 26b (step S1100).

Figure 21:
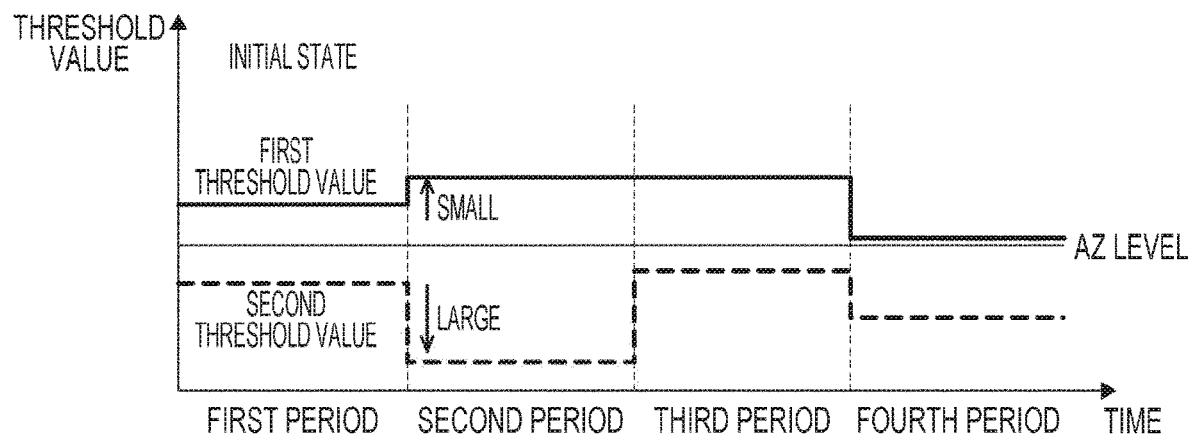
FIG. 21 is a diagram schematically illustrating a processing example in which the first threshold value and the second threshold value are independently adjusted.

FIG. 21 is a diagram schematically illustrating a processing example in which the first threshold value for the on-event and the second threshold value for the off-event are independently adjusted. The horizontal axis indicates time, and the vertical axis indicates a threshold value.

As described above, the threshold value control unit 26b independently sets the first threshold value and the second threshold value according to the noise level of the light shielding pixel 30 in the light shielding area 21a. Therefore, sensitivity adjustment for a true event in which the absolute value of the change amount in the direction in which the signal level of the electrical signal increases exceeds the first threshold value and a dark time noise event corresponding to an on-event can be performed. Furthermore, at the same time, sensitivity adjustment for a true event in which the absolute value of the change amount in the direction in which the signal level of the electrical signal increases exceeds the second threshold value and a dark time noise event corresponding to an off-event can be performed. As described above, since the first threshold value and the second threshold value can be adjusted independently, sensitivity adjustment can be more appropriately performed even in a case where there is a statistical bias in the occurrence distribution of the dark time noise event corresponding to the on-event and the dark time noise event corresponding to the off-event.

Figure 22:
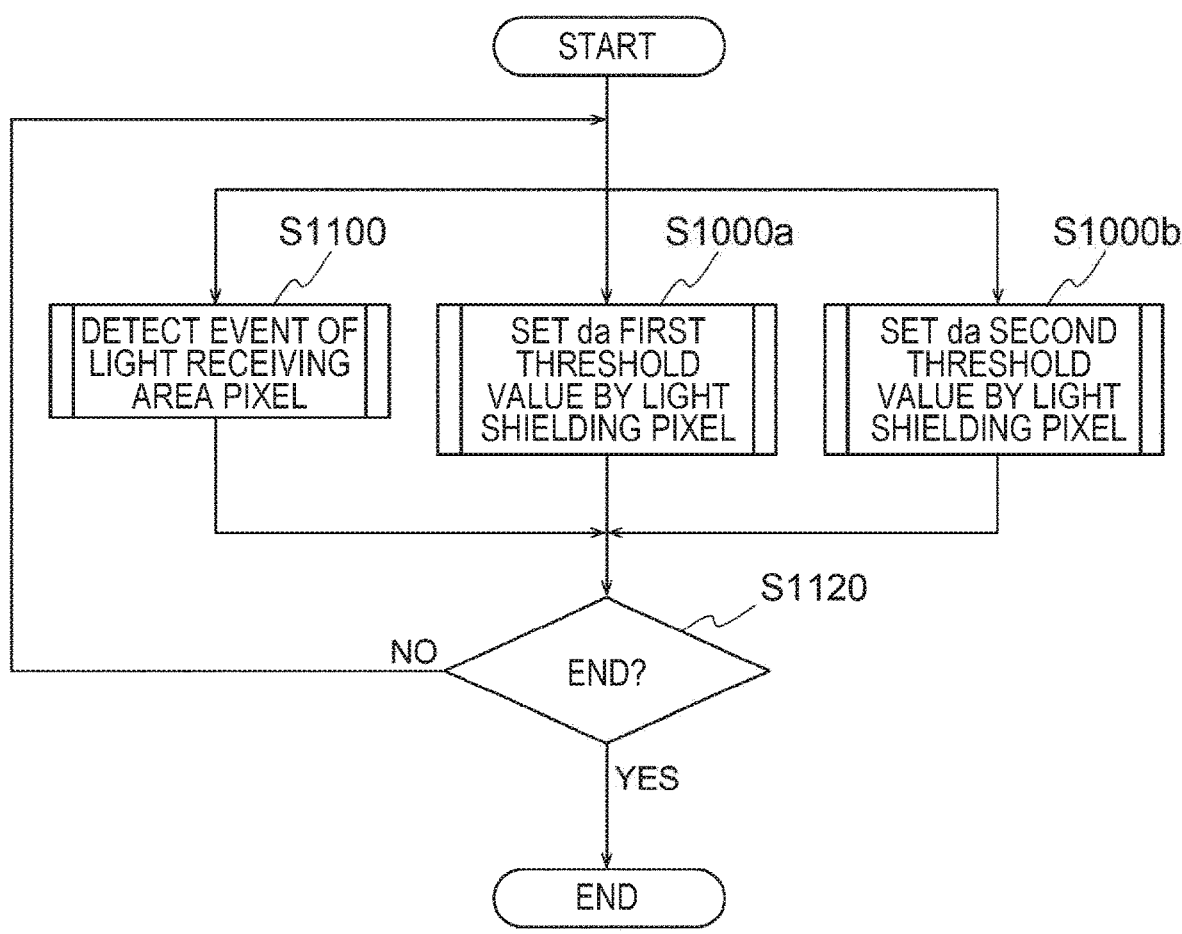
FIG. 22 is a flowchart illustrating a processing example in which the first threshold value and the second threshold value are independently adjusted in the parallel processing.

FIG. 22 is a flowchart illustrating a processing example in which the first threshold value and the second threshold value are independently adjusted in the parallel processing. As illustrated in FIG. 21, the threshold value control unit 26b performs the processing of setting the first threshold value according to the level of the on-event of the light shielding pixel 30 in the light shielding area 21a (step S1000a), and in parallel, the processing setting the second threshold value according to the level of the off-event of the light shielding pixel 30 in the light shielding area 21a (step S1000b), and the processing of detecting the address event detection unit 33 in the light receiving area 21b (step S1100) in parallel.

As described above, by performing the processing in parallel, the first threshold value and the second threshold value can be independently adjusted without stopping the event detection of the address event detection unit 33 in the light receiving area 21b.

Figure 23:
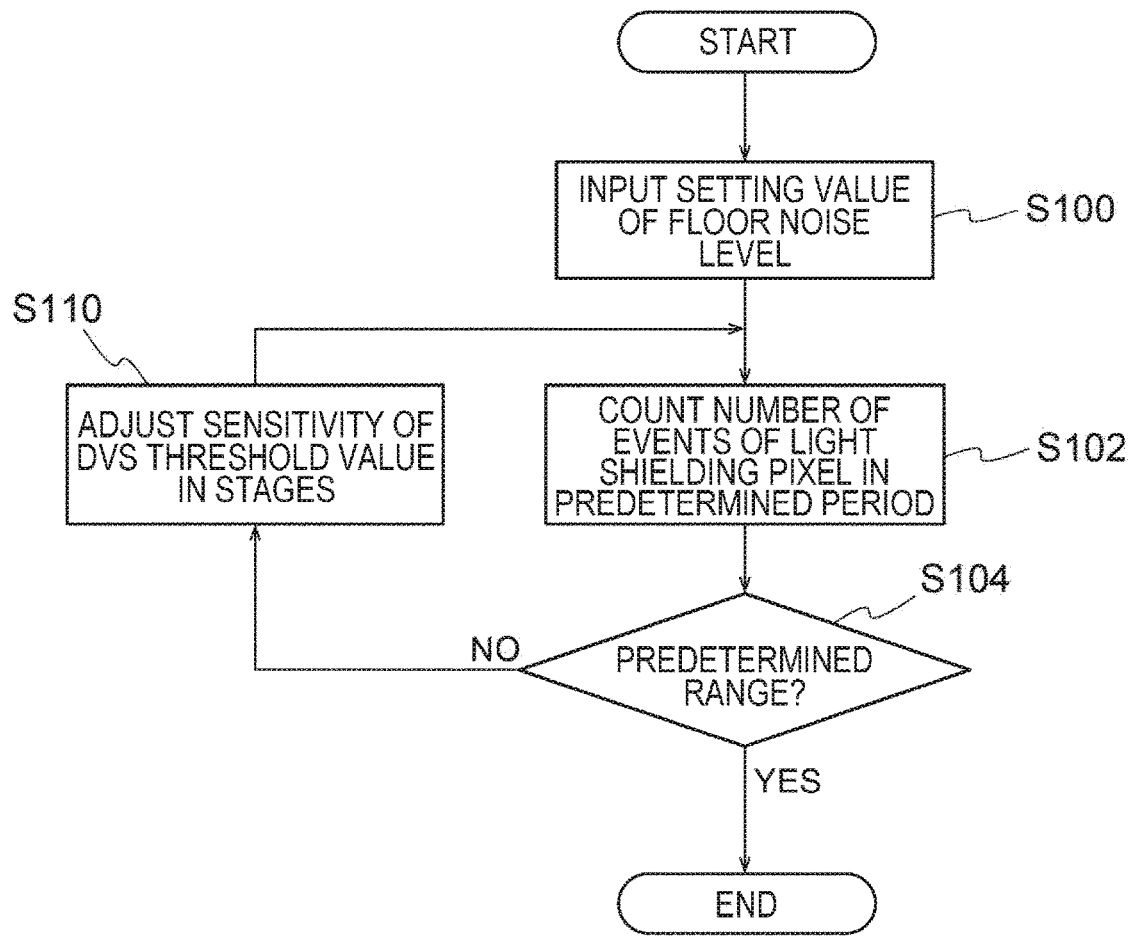
FIG. 23 is a flowchart illustrating an example in which a threshold value is changed in stages.

FIG. 23 is a flowchart illustrating an example in which a threshold value is changed in stages in the processing of setting processing of the threshold value (step S1000).

Figure 24:
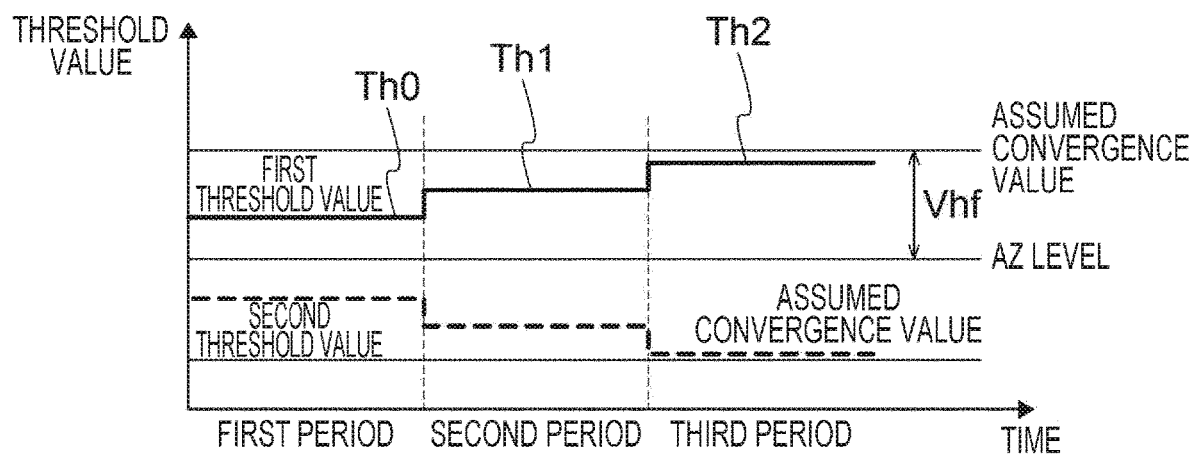
FIG. 24 is a diagram schematically illustrating a processing example illustrated in FIG. 23.

FIG. 24 is a diagram schematically illustrating a processing example illustrated in FIG. 23. The horizontal axis indicates time, and the vertical axis indicates a threshold value. As illustrated in FIG. 20, change amounts of the first threshold value for the on-event and the second threshold value for the off-event with respect to the reference level (AZ level) are changed in stages in time series. For example, the threshold value is changed in several stages until the threshold value reaches the convergence assumed value. Here, in a case where the assumed convergence value is the AZ level+a predetermined value Vhf, a predetermined value Th1 is changed to the AZ level+Vhf×0.8, the predetermined value Th2 is changed to the AZ level+Thf×0.96, and the like in a manner that the value asymptotically approaches the assumed convergence value of the threshold value with the lapse of time.

As illustrated FIG. 23, the threshold value control unit 26b determines whether or not the count number of events (the number of on-events+the number of off-events) within a predetermined time with respect to a threshold value Th0 that has been initially set is equal to or more than a predetermined range (step S104). In a case where the number of events is a predetermined value or more (YES in step S104), the threshold value control unit 26b decreases the sensitivity of the threshold value in stages (step S108a). That is, in the first period, the threshold value control unit 26b increases the first threshold value voltage $V_{th1}$ from the reference level by the predetermined value Th1 volt and decreases the second threshold value voltage $V_{th2}$ from the reference level by the predetermined value Th1 volt with respect to the pixels 30 of the entire pixel array unit 21. Next, in the second period, the threshold value control unit 26b increases the first threshold value voltage $V_{th1}$ from the reference level by the predetermined value Th2 volt and decreases the second threshold value voltage $V_{th2}$ from the reference level by the predetermined value Th2 volt with respect to the pixels 30 of the entire pixel array unit 21. In this case, the absolute value of (Th2−Th1) is smaller than the absolute value of (Th1−Th0).

On the other hand, in a case where the number of events is less than a predetermined value (NO in step S104), the threshold value control unit 26b does not change the current threshold value and ends the entire processing.

As described above, since the threshold value is changed in stages, it is possible to set the sensitivity close to the target number of noise events at dark time. Furthermore, since the threshold value is changed in stages, the threshold value can be changed while suppressing a change in the number of occurrences of events per unit time of the pixel 30 in the light receiving area 21b.

Figure 25:
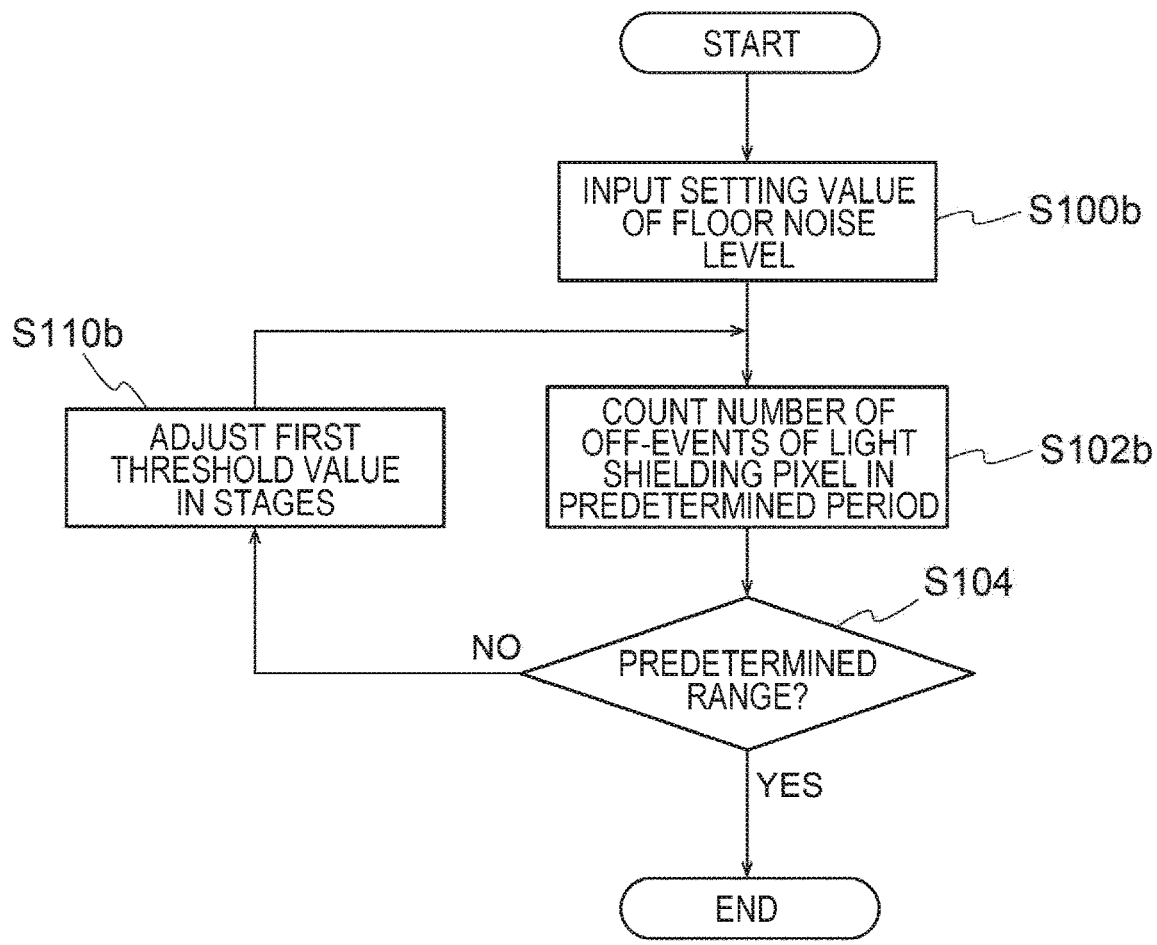
FIG. 25 is a flowchart illustrating an example in which the first threshold value is changed in stages.

FIG. 25 is a flowchart illustrating an example in which the first threshold value is changed in stages in the processing of setting processing of the threshold value (step S1000a). As illustrated in FIG. 25, the on-event of the light shielding pixel is counted (step S102a), and in a case where the count number does not fall within a predetermined range, the first threshold value is changed in stages (step S110a). As described above, even in a case where the first threshold value and the second threshold value are adjusted independently, it is possible to perform processing of changing the first threshold value in stages.

Figure 26:
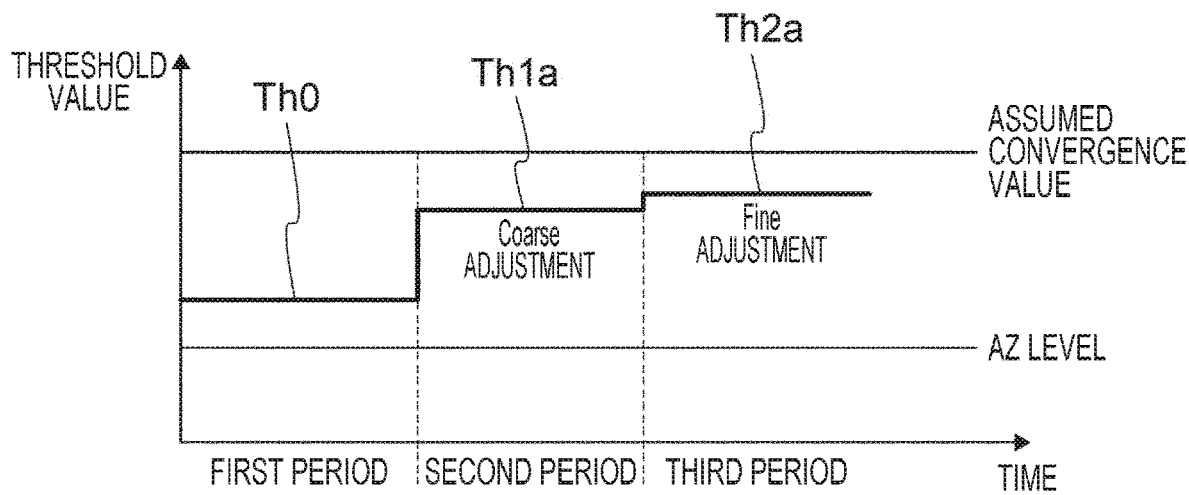
FIG. 26 is a diagram schematically illustrating an example in which the first threshold value is changed in stages.

FIG. 26 is a diagram schematically illustrating an example in which the first threshold value is changed in stages. The horizontal axis indicates time, and the vertical axis indicates the first threshold value. As illustrated in FIG. 26, a first threshold value Th0a that has been initially set is changed to a first threshold value Th1a in the first stage, and is changed to a first threshold Th2a in the second stage. As described above, by roughly adjusting and then gradually converging the first threshold value, convergence can be accelerated while divergence is suppressed. Note that the processing illustrated in FIG. 26 is also applicable to setting processing the threshold value (step S1000).

Figure 27:
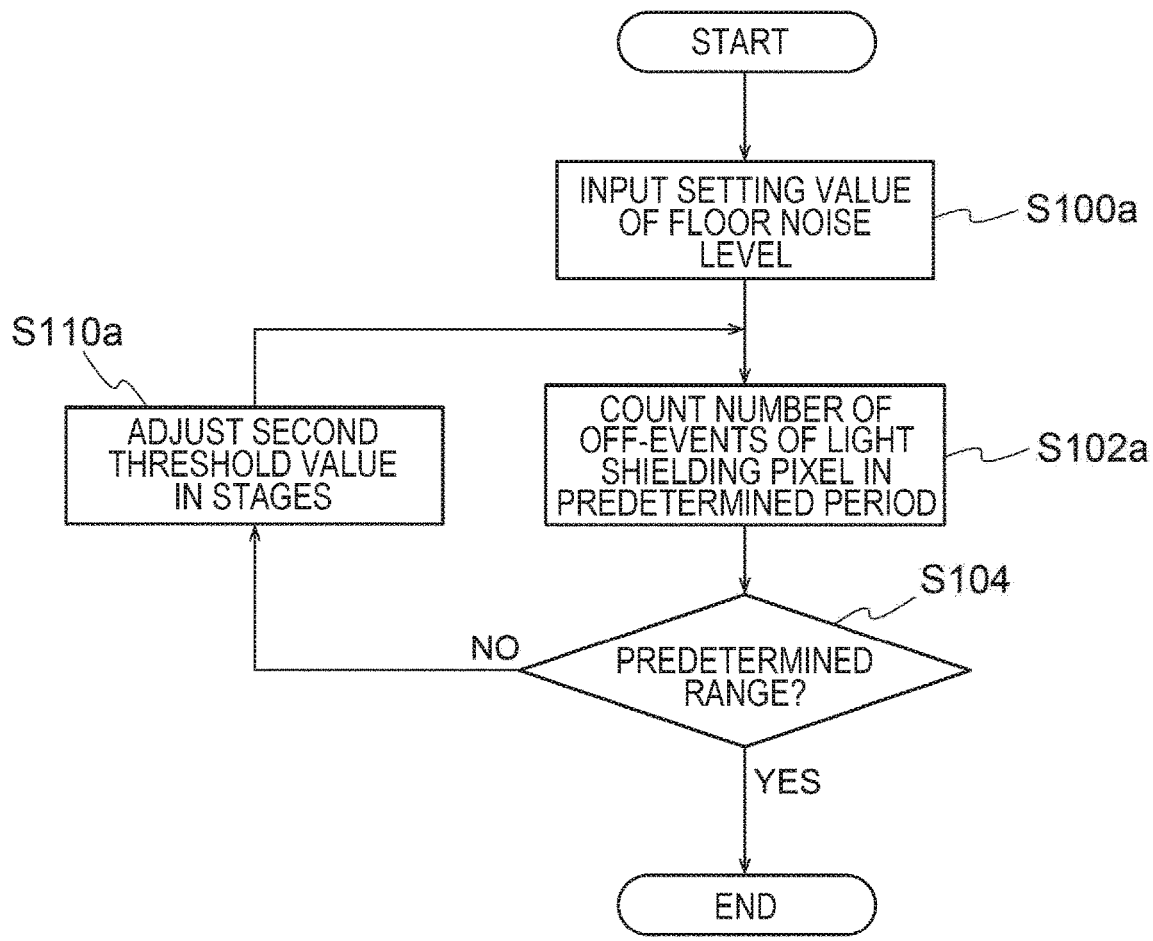
FIG. 27 is a flowchart illustrating an example in which the second threshold value is changed in stages.

FIG. 27 is a flowchart illustrating an example in which the second threshold value is changed in stages in the processing of setting processing of the threshold value (step S1000b). As illustrated in FIG. 27, the off-event of the light shielding pixel is counted (step S102b), and in a case where the count number does not fall within a predetermined range, the second threshold value is changed in stages (step S110b). As described above, even in a case where the first threshold value and the second threshold value are adjusted independently, it is possible to perform processing of changing the second threshold value in stages.

Figure 28:
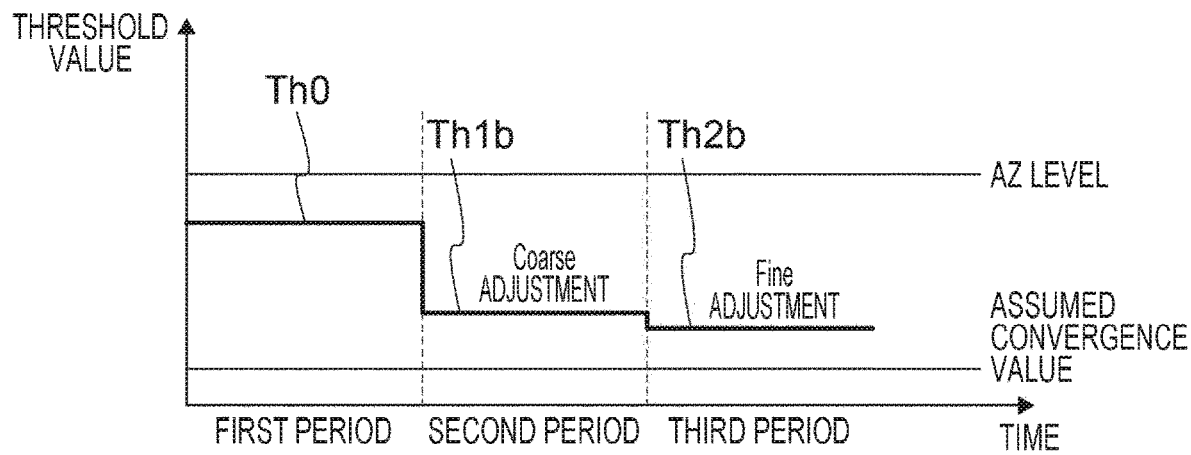
FIG. 28 is a diagram schematically illustrating an example in which the second threshold value is changed in stages.

FIG. 28 is a diagram schematically illustrating an example in which the second threshold value is changed in stages. The horizontal axis indicates time, and the vertical axis indicates the first threshold value. As illustrated in FIG. 28, a first threshold value Th0b that has been initially set is changed to a first threshold value Th1b in the first stage, and is changed to a first threshold Th2b in the second stage. As described above, by roughly adjusting and then gradually converging the second threshold value, convergence can be accelerated while divergence is suppressed. Note that the processing illustrated in FIG. 28 is also applicable to setting processing the threshold value (step S1000).

Figure 29:
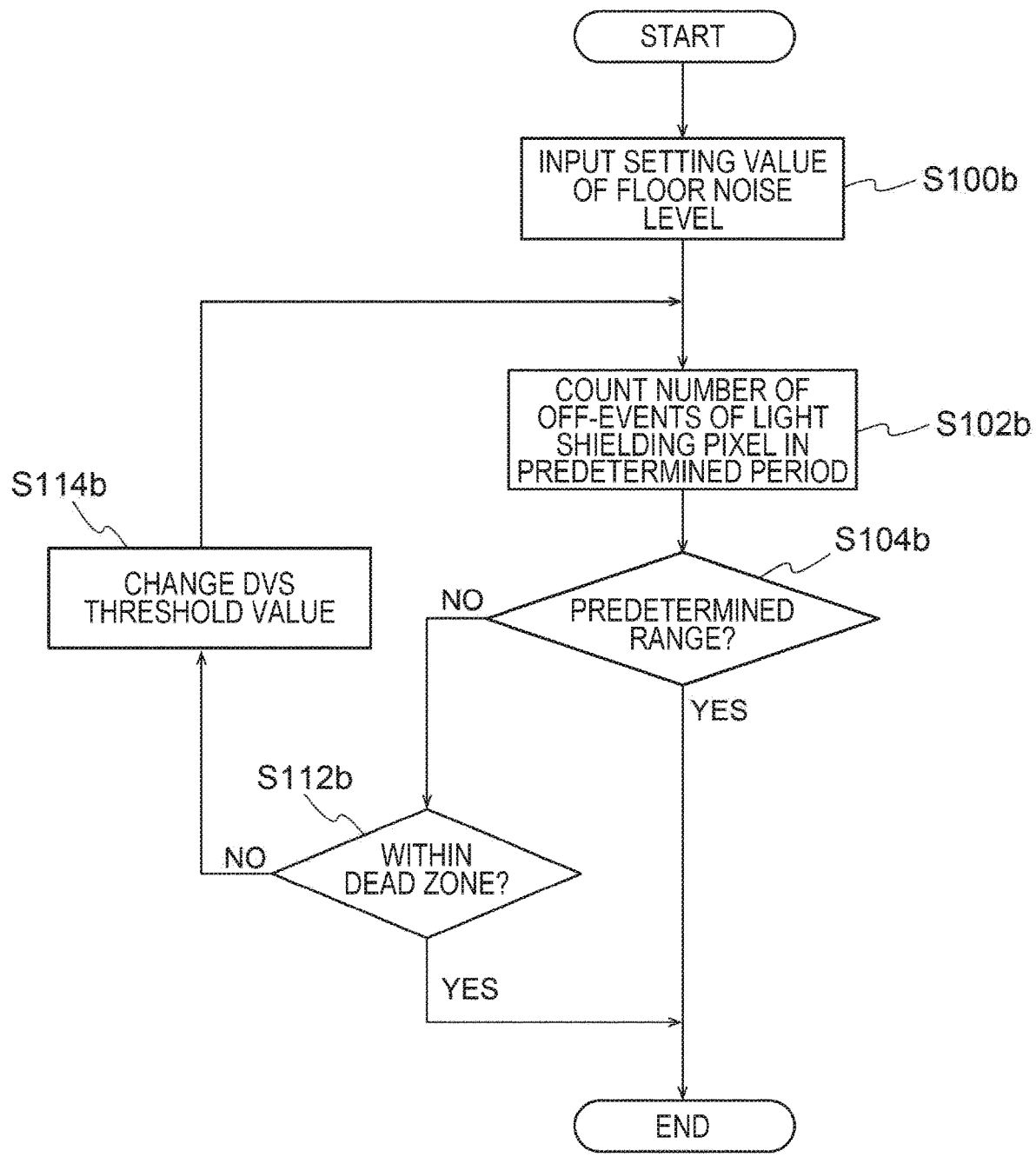
FIG. 29 is a flowchart illustrating an example in which a dead zone is provided.
Figure 30:
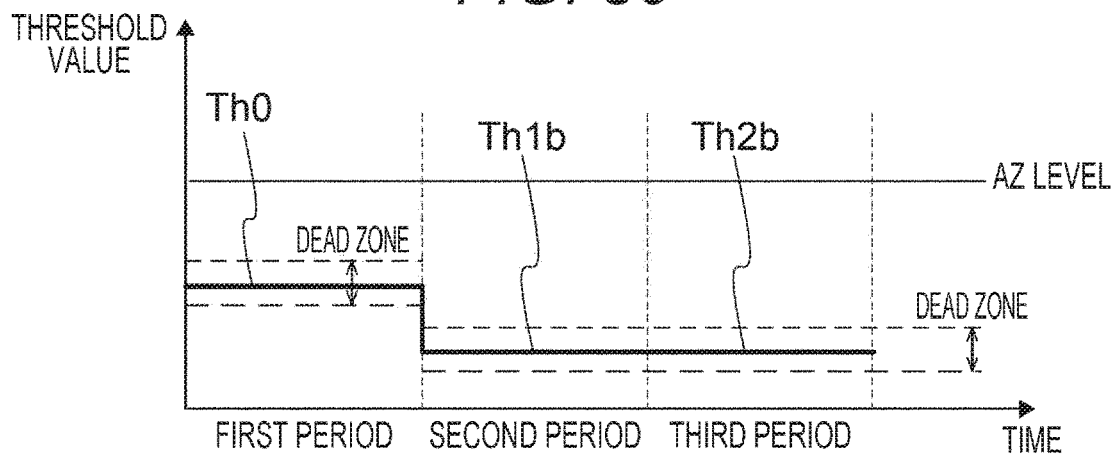
FIG. 30 is a diagram schematically illustrating an example in which the second threshold value provided with the dead zone is changed in stages.

FIG. 29 is a flowchart illustrating an example in which a dead zone is provided in the processing of setting processing of the threshold value (step S1000b). FIG. 30 is a diagram schematically illustrating an example in which the second threshold value provided with the dead zone is changed in stages. The horizontal axis indicates time, and the vertical axis indicates the second threshold value.

Here, the dead zone means a threshold value provided above and below the second threshold values Th0b, Th1b, Th2b, and the like. For example, 10% before and after the absolute value of the difference between the AZ level and the second threshold value Th0b is set as the dead zone. More specifically, when the AZ level is, for example, 100 and the second threshold Th0b is 50, the absolute value of the difference between the AZ level and the second threshold value Th0b is (100−50), and 10% before and after the absolute value of the difference is 50×0.1=±5. That is, the dead zone is in the range of 45 to 55. For example, in a case where the threshold value of the second threshold value Th0b is changed, the threshold value is not changed when the second threshold value Th1b is within the dead zone, and the threshold value is changed when the second threshold value Th1b is out of the dead zone. In FIG. 30, since the second threshold value Th1b is out of the dead zone range of the second threshold value Th0b, the value of the second threshold value Th1b is changed from the second threshold value Th0b. On the other hand, since the second threshold value Th2b is out of the dead zone range of the second threshold value Th1b, the value of the second threshold value Th2b is the same value as the second threshold Th1b and is not changed.

As illustrated in FIG. 29, the threshold value control unit 26b determines whether or not the value of the second threshold value Th1b to be changed is within the range of the dead zone of the current second threshold value Th0b (step S112b) in a case where the number of off-events is within a predetermined range (NO in step S104b). The threshold value control unit 26b changes the value of the second threshold value Th1b from the second threshold value Th0b in a case where the value is out of the dead zone range (NO in step S112b). On the other hand, in a case where the number is within the dead zone range (YES in step S112b), the value of the second threshold value Th1b is maintained at the value of the second threshold value Th0b, and the processing is ended.

When the amount by which the threshold value should be changed is within the dead zone, the threshold value is not changed. Note that the processing illustrated in FIG. 30 is also applicable to setting processing the threshold value (step S1000 and step S1000a).

For example, in a case where the threshold value is changed, the observer may feel the variation in the image. For this reason, when the range of the dead zone is increased, the threshold value is not changed, and the observer is prevented from feeling the variation in the image. On the other hand, when the range of the dead zone is increased, sensitivity adjustment is suppressed. For this reason, by adjusting the range of the dead zone, sensitivity adjustment and image variation can be balanced.

Figure 31:
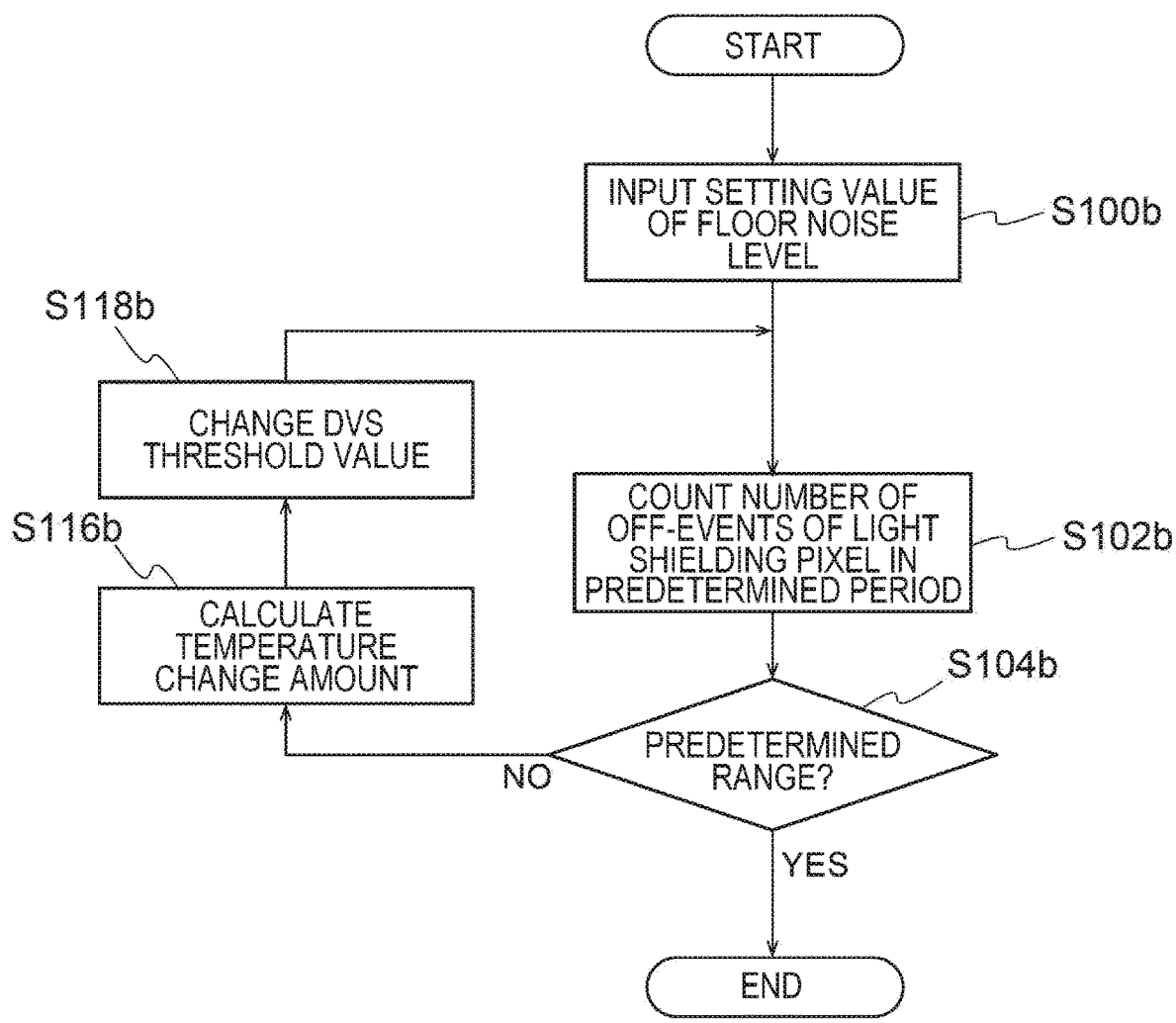
FIG. 31 is a flowchart illustrating an example in which a change amount of the threshold value is changed according to a temperature change.
Figure 32:
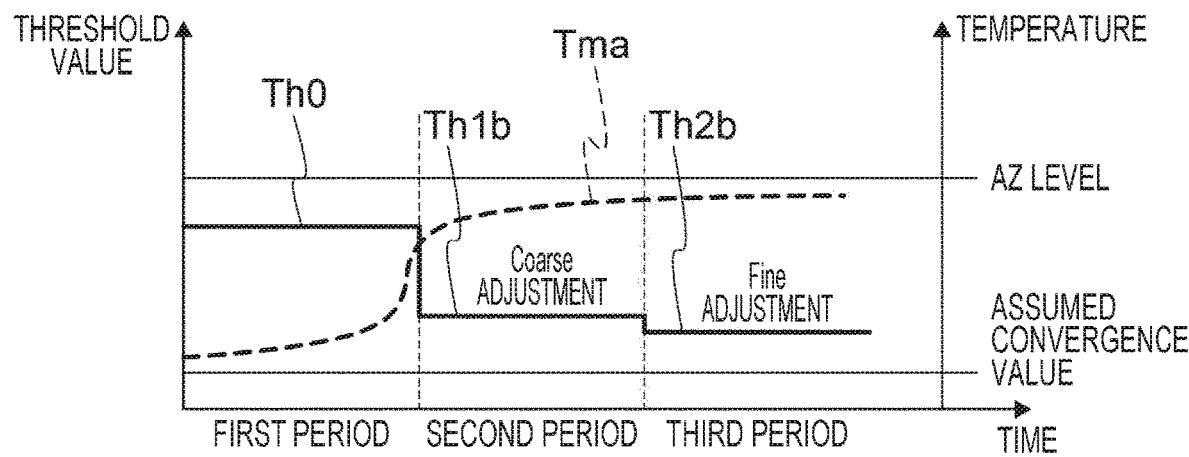
FIG. 32 is a flowchart schematically illustrating an example in which the change amount of the threshold value is changed according to a temperature change.

FIG. 31 is a flowchart illustrating an example in which a change amount of the threshold value is changed according to a temperature change in the processing of the setting processing of the threshold value (step S1000b). FIG. 32 is a flowchart schematically illustrating an example in which the change amount of the threshold value is changed according to a temperature change. The horizontal axis indicates time, and the vertical axis indicates the second threshold value. As illustrated in FIG. 32, the change amount of the second threshold value Th1b in the area where the temporal change of a time series value Tma of the temperature is large is increased.

As illustrated in FIG. 31, in a case where the number of off-events is within a predetermined range (NO in step S104b), the threshold value control unit 26b calculates the temporal change amount of the temperature using the temperature information corresponding to the pixel 30 in the light receiving area 21b recorded in time series in the recording unit 12. For example, the absolute value of the time difference of the temperature is calculated (step S116b). The temperature acquired from the temperature sensor 21c is recorded in time series in the recording unit 12.

Next, the threshold value control unit 26b calculates the change amount of the second threshold value on the basis of the change amount of the temperature and changes the second threshold value (step S118b). As described above, the change amount of the second threshold value is adjusted according to the temporal change amount of the temperature. As illustrated in FIG. 14, since the temperature change and the noise change are correlated, the change amount of the second threshold value can be increased at a timing when the temperature change is large, in a manner that the sensitivity can be adjusted more efficiently.

As described above, according to the present embodiment, the threshold value control unit 26b sets the threshold value according to the noise level of the light shielding pixel 30 in the light shielding area 21a. Therefore, since the occurrence amount of the dark time noise event can be adjusted, sensitivity adjustment for the true event and the dark time noise event can be performed.

Modification of First Embodiment

An imaging system 10 according to a modification of the first embodiment is different from the imaging system 10 according to the first embodiment in that an arithmetic processing unit 15 for setting a threshold value is provided outside the imaging device 20. Differences from the imaging system 10 according to the first embodiment will be described below.

Figure 33:
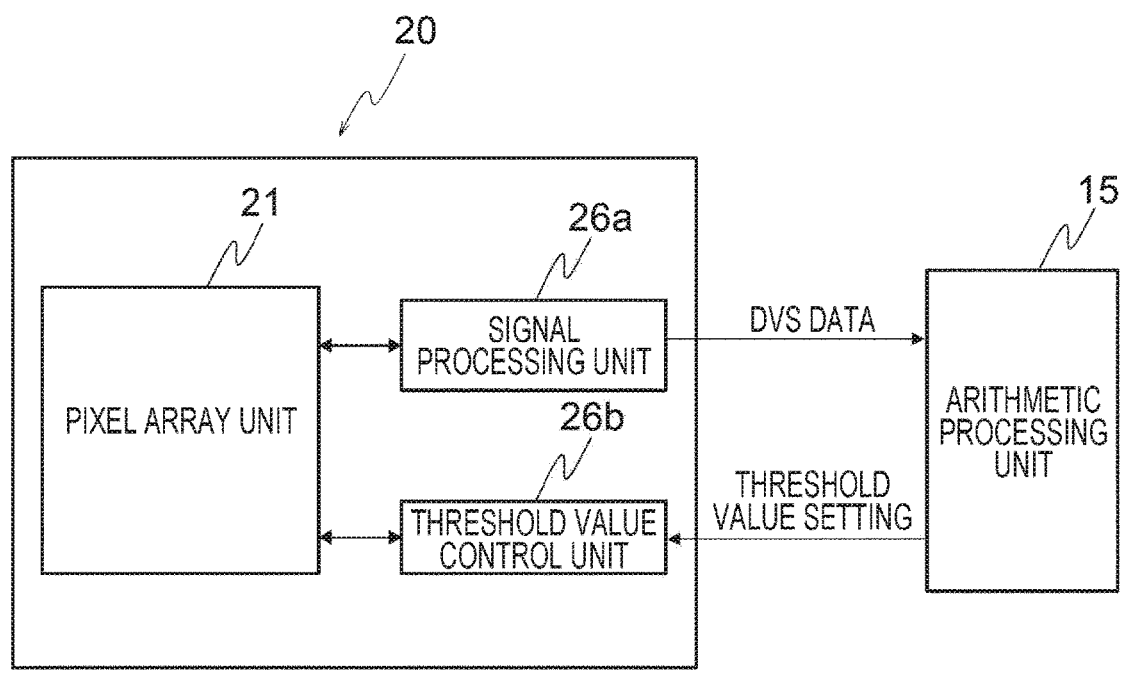
FIG. 33 is a block diagram illustrating a configuration of an imaging device according to a modification of a first embodiment.

FIG. 33 is a block diagram illustrating a configuration of an imaging device 20 according to a modification of the first embodiment. In FIG. 33, the drive unit 22, the arbiter unit 23, and the column processing unit 24 are not illustrated. As illustrated in FIG. 33, the arithmetic processing unit 15 is provided outside the imaging device 20. The arithmetic processing unit 15 is a device in which a user can change an arithmetic program and a processing parameter. Therefore, a user can set the threshold value by an arbitrary algorithm.
<Application Example of Technology According to Present Disclosure>

The technology according to the present disclosure can be applied to various products. Hereinafter, a more specific application example will be described. For example, the technology according to the present disclosure may be realized as a distance measuring device mounted on any type of moving body such as an automobile, an electric vehicle, a hybrid electric vehicle, a motorcycle, a bicycle, a personal mobility, an airplane, a drone, a ship, a robot, a construction machine, and an agricultural machine (tractor).
[Moving Body]

Figure 34:
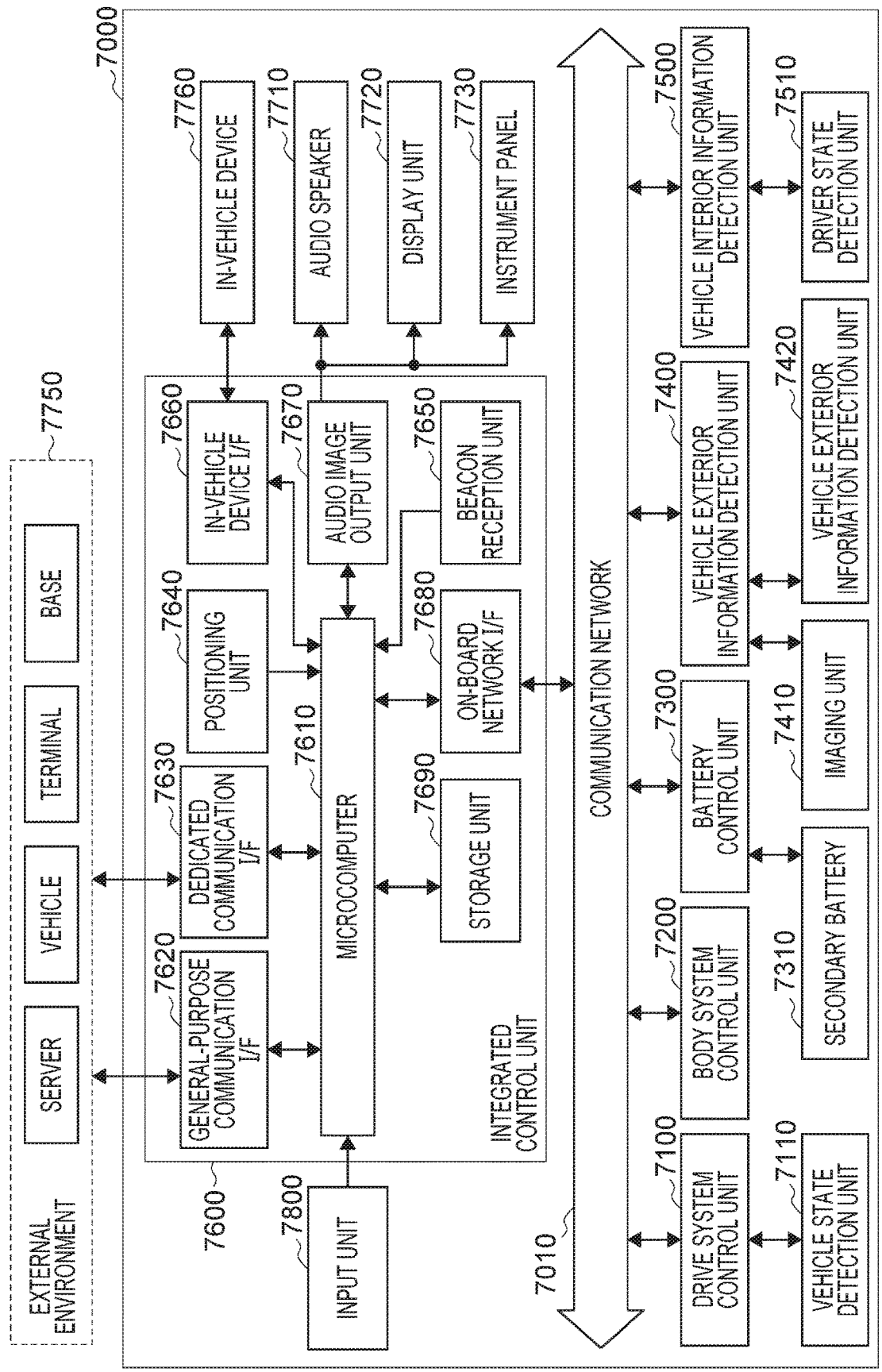
FIG. 34 is a block diagram illustrating a schematic configuration example of a vehicle control system which is an example of a moving body control system to which the technology according to the present disclosure can be applied.

FIG. 34 is a block diagram illustrating a schematic configuration example of a vehicle control system 7000 which is an example of a moving body control system to which the technology according to the present disclosure can be applied. The vehicle control system 7000 includes a plurality of electronic control units connected via a communication network 7010. In the example illustrated in FIG. 31, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. The communication network 7010 connecting the plurality of control units may be, for example, an on-board communication network conforming to an arbitrary standard such as a controller area network (CAN), a local interconnect network (LIN), a local area network (LAN), or FlexRay (registered trademark).

Each control unit includes a microcomputer that performs arithmetic processing according to various programs, a storage unit that stores programs executed by the microcomputer, parameters used for various calculations, and the like, and a drive circuit that drives various devices to be controlled. Each control unit includes a network I/F for communicating with other control units via the communication network 7010, and a communication I/F for communicating with devices, sensors, and the like inside and outside the vehicle by wired communication or wireless communication. In FIG. 34, as a functional configuration of the integrated control unit 7600, a microcomputer 7610, a general-purpose communication I/F 7620, a dedicated communication I/F 7630, a positioning unit 7640, a beacon reception unit 7650, an in-vehicle device I/F 7660, an audio image output unit 7670, an on-board network I/F 7680, and a storage unit 7690 are illustrated. The other control units similarly include a microcomputer, a communication I/F, a storage unit, and the like.

The drive system control unit 7100 controls the operation of devices related to the drive system of the vehicle according to various programs. For example, the drive system control unit 7100 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like. The drive system control unit 7100 may have a function as a control device such as an antilock brake system (ABS) or an electronic stability control (ESC).

A vehicle state detection unit 7110 is connected to the drive system control unit 7100. The vehicle state detection unit 7110 includes, for example, at least one of a gyro sensor that detects an angular velocity of axial rotational motion of a vehicle body, an acceleration sensor that detects acceleration of the vehicle, or a sensor for detecting an operation amount of an accelerator pedal, an operation amount of a brake pedal, a steering angle of a steering wheel, an engine speed, a wheel rotation speed, and the like. The drive system control unit 7100 performs arithmetic processing using a signal input from the vehicle state detection unit 7110, and controls an internal combustion engine, a driving motor, an electric power steering device, a brake device, and the like.

The body system control unit 7200 controls operations of various devices mounted on the vehicle body according to various programs. For example, the body system control unit 7200 functions as a control device of a keyless entry system, a smart key system, a power window device, or various lamps such as a head lamp, a back lamp, a brake lamp, a blinker, or a fog lamp. In this case, radio waves transmitted from a portable device that substitutes for a key or signals of various switches can be input to the body system control unit 7200. The body system control unit 7200 receives input of these radio waves or signals, and controls a door lock device, a power window device, a lamp, and the like of the vehicle.

The battery control unit 7300 controls a secondary battery 7310, which is a power supply source of the driving motor, according to various programs. For example, information such as a battery temperature, a battery output voltage, or a remaining capacity of a battery is input to the battery control unit 7300 from a battery device including the secondary battery 7310. The battery control unit 7300 performs arithmetic processing using these signals, and performs temperature adjustment control of the secondary battery 7310 or control of a cooling device and the like included in the battery device.

The vehicle exterior information detection unit 7400 detects information outside the vehicle on which the vehicle control system 7000 is mounted. For example, at least one of an imaging unit 7410 or a vehicle exterior information detection unit 7420 is connected to the vehicle exterior information detection unit 7400. The imaging unit 7410 includes at least one of a time of flight (ToF) camera, a stereo camera, a monocular camera, an infrared camera, or other cameras. The vehicle exterior information detection unit 7420 includes, for example, at least one of an environment sensor for detecting current weather or weather, or a surrounding information detection sensor for detecting another vehicle, an obstacle, a pedestrian, and the like around the vehicle on which the vehicle control system 7000 is mounted.

The environment sensor may be, for example, at least one of a raindrop sensor that detects rainy weather, a fog sensor that detects fog, a sunshine sensor that detects a degree of sunshine, or a snow sensor that detects snowfall. The surrounding information detection sensor may be at least one of an ultrasonic sensor, a radar device, or a light detection and ranging, laser imaging detection and ranging (LIDAR) device. The imaging unit 7410 and the vehicle exterior information detection unit 7420 may be provided as independent sensors or devices, or may be provided as a device in which a plurality of sensors or devices is integrated.

Figure 35:
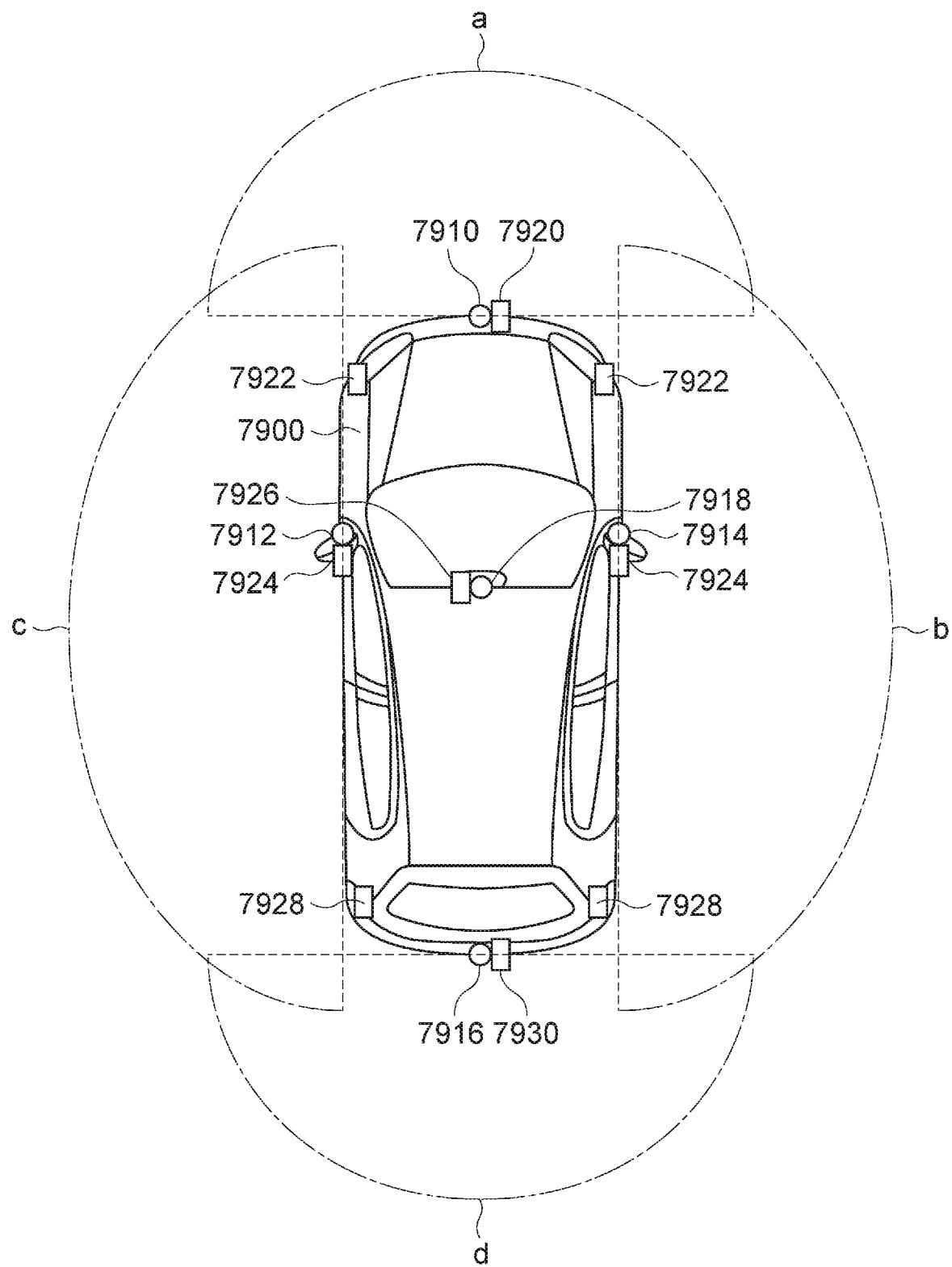
FIG. 35 is a diagram illustrating an example of installation positions of an imaging unit and a vehicle exterior information detection unit.

Here, FIG. 35 illustrates an example of installation positions of the imaging unit 7410 and the vehicle exterior information detection unit 7420. Imaging units 7910, 7912, 7914, 7916, and 7918 are provided, for example, at least one of a front nose, a side mirror, a rear bumper, a back door, or an upper portion of a windshield in a vehicle interior of a vehicle 7900. The imaging unit 7910 provided at the front nose and the imaging unit 7918 provided at the upper portion of the windshield in the vehicle interior mainly acquire images in front of the vehicle 7900. The imaging units 7912 and 7914 provided at the side mirrors mainly acquire images of the sides of the vehicle 7900. The imaging unit 7916 provided on the rear bumper or the back door mainly acquires an image behind the vehicle 7900. The imaging unit 7918 provided at the upper portion of the windshield in the vehicle interior is mainly used to detect a preceding vehicle, a pedestrian, an obstacle, a traffic light, a traffic sign, a lane, and the like.

Note that FIG. 35 illustrates an example of imaging ranges of the respective imaging units 7910, 7912, 7914, and 7916. An imaging range a indicates an imaging range of the imaging unit 7910 provided at the front nose, imaging ranges b and c indicate imaging ranges of the imaging units 7912 and 7914 provided at the side mirrors, respectively, and an imaging range d indicates an imaging range of the imaging unit 7916 provided at the rear bumper or the back door. For example, by superimposing image data captured by the imaging units 7910, 7912, 7914, and 7916, an overhead view image of the vehicle 7900 viewed from above can be obtained.

Vehicle exterior information detection units 7920, 7922, 7924, 7926, 7928, and 7930 provided at the front, rear, sides, corners, and the upper portion of the windshield in the vehicle interior of the vehicle 7900 may be, for example, ultrasonic sensors or radar devices. The vehicle exterior information detection units 7920, 7926, and 7930 provided at the front nose, the rear bumper, the back door, and the upper portion of the windshield in the vehicle interior of the vehicle 7900 may be, for example, LIDAR devices. These vehicle exterior information detection units 7920 to 7930 are mainly used for detecting a preceding vehicle, a pedestrian, an obstacle, and the like.

Returning to FIG. 34, the description will be continued. The vehicle exterior information detection unit 7400 causes the imaging unit 7410 to capture an image outside the vehicle, and receives the captured image data. Furthermore, the vehicle exterior information detection unit 7400 receives detection information from the connected vehicle exterior information detection unit 7420. In a case where the vehicle exterior information detection unit 7420 is an ultrasonic sensor, a radar device, or a LIDAR device, the vehicle exterior information detection unit 7400 transmits ultrasonic waves, electromagnetic waves, and the like, and receives information of received reflected waves. The vehicle exterior information detection unit 7400 may perform object detection processing or distance detection processing of a person, a vehicle, an obstacle, a sign, a character on a road surface, and the like on the basis of the received information. The vehicle exterior information detection unit 7400 may perform environment recognition processing of recognizing rainfall, fog, road surface conditions, and the like on the basis of the received information. The vehicle exterior information detection unit 7400 may calculate a distance to an object outside the vehicle on the basis of the received information.

Furthermore, the vehicle exterior information detection unit 7400 may perform image recognition processing or distance detection processing of a person, a vehicle, an obstacle, a sign, a character on a road surface, and the like on the basis of the received image data. The vehicle exterior information detection unit 7400 may perform processing such as distortion correction or alignment on the received image data, and combine image data captured by different imaging units 7410 to generate an overhead view image or a panoramic image. The vehicle exterior information detection unit 7400 may perform viewpoint conversion processing using image data captured by different imaging units 7410.

The vehicle interior information detection unit 7500 detects information inside the vehicle. For example, a driver state detection unit 7510 that detects a state of a driver is connected to the vehicle interior information detection unit 7500. The driver state detection unit 7510 may include a camera that images the driver, a biological sensor that detects biological information of the driver, a microphone that collects sound in the vehicle interior, and the like. The biological sensor is provided, for example, on a seat surface, a steering wheel, and the like, and detects biological information of a passenger sitting on a seat or a driver holding the steering wheel. The vehicle interior information detection unit 7500 may calculate the degree of fatigue or the degree of concentration of the driver or may determine whether or not the driver is dozing on the basis of the detection information input from the driver state detection unit 7510. The vehicle interior information detection unit 7500 may perform processing such as noise canceling processing on the collected sound signal.

The integrated control unit 7600 controls the overall operation in the vehicle control system 7000 according to various programs. An input unit 7800 is connected to the integrated control unit 7600. The input unit 7800 is realized by, for example, a device such as a touch panel, a button, a microphone, a switch, or a lever that can be operated by a passenger for input. Data obtained by performing voice recognition on the voice input by the microphone may be input to the integrated control unit 7600. The input unit 7800 may be, for example, a remote control device using infrared rays or other radio waves, or an external connection device such as a mobile phone or a personal digital assistant (PDA) corresponding to the operation of the vehicle control system 7000. The input unit 7800 may be, for example, a camera, and in this case, the passenger can input information by gesture. Alternatively, data obtained by detecting the movement of the wearable device worn by the passenger may be input. Moreover, the input unit 7800 may include, for example, an input control circuit and the like that generates an input signal on the basis of information input by the passenger and the like using the above input unit 7800 and outputs the input signal to the integrated control unit 7600. By operating the input unit 7800, the passenger and the like inputs various data to the vehicle control system 7000 or gives an instruction on a processing operation.

The storage unit 7690 may include a read only memory (ROM) that stores various programs to be executed by the microcomputer, and a random access memory (RAM) that stores various parameters, calculation results, sensor values, and the like. Furthermore, the storage unit 7690 may be realized by a magnetic storage device such as a hard disc drive (HDD), a semiconductor storage device, an optical storage device, a magneto-optical storage device, and the like.

The general-purpose communication I/F 7620 is a general-purpose communication I/F that mediates communication with various devices existing in an external environment 7750. The general-purpose communication I/F 7620 may implement a cellular communication protocol such as global system of mobile communications (GSM) (registered trademark), WiMAX, long term evolution (LTE), or LTE-Advanced (LTE-A), or another wireless communication protocol such as wireless LAN (also referred to as Wi-Fi (registered trademark)) or Bluetooth (registered trademark). The general-purpose communication I/F 7620 may be connected to a device (for example, an application server or a control server) existing on an external network (for example, the Internet, a cloud network, or a company-specific network) via, for example, a base station or an access point. Furthermore, the general-purpose communication I/F 7620 may be connected to a terminal (for example, a terminal of a driver, a pedestrian, or a store, or a machine type communication (MTC) terminal) existing in the vicinity of the vehicle using, for example, a peer to peer (P2P) technology.

The dedicated communication I/F 7630 is a communication I/F that supports a communication protocol formulated for use in a vehicle. For example, the dedicated communication I/F 7630 may implement a standard protocol such as wireless access in vehicle environment (WAVE) which is a combination of IEEE802.11p of the lower layer and IEEE1609 of the upper layer, dedicated short range communications (DSRC), or a cellular communication protocol. The dedicated communication I/F 7630 typically performs V2X communication which is a concept including one or more of vehicle to vehicle communication, vehicle to infrastructure communication, vehicle to home communication, and vehicle to pedestrian communication.

The positioning unit 7640 receives, for example, a global navigation satellite system (GNSS) signal from a GNSS satellite (for example, a global positioning system (GPS) signal from a GPS satellite), executes positioning, and generates position information including the latitude, longitude, and altitude of the vehicle. Note that the positioning unit 7640 may specify the current position by exchanging a signal with a wireless access point, or may acquire the position information from a terminal such as a mobile phone, a PHS, or a smartphone having a positioning function.

The beacon reception unit 7650 receives, for example, radio waves or electromagnetic waves transmitted from a wireless station and the like installed on a road, and acquires information such as a current position, a traffic jam, a closed road, a required time, and the like. Note that the function of the beacon reception unit 7650 may be included in the dedicated communication I/F 7630 described above.

The in-vehicle device I/F 7660 is a communication interface that mediates connection between the microcomputer 7610 and various in-vehicle devices 7760 existing in the vehicle. The in-vehicle device I/F 7660 may establish wireless connection using a wireless communication protocol such as wireless LAN, Bluetooth (registered trademark), near field communication (NFC), or wireless USB (WUSB). Furthermore, the in-vehicle device I/F 7660 may establish wired connection such as universal serial bus (USB), high-definition multimedia interface (HDMI) (registered trademark), or mobile high-definition link (MHL) via a connection terminal (and, if necessary, a cable) not illustrated. The in-vehicle device 7760 may include, for example, at least one of a mobile device or a wearable device possessed by a passenger, or an information device carried in or attached to the vehicle. Furthermore, the in-vehicle device 7760 may include a navigation device that searches for a route to an arbitrary destination. The in-vehicle device I/F 7660 exchanges a control signal or a data signal with these in-vehicle devices 7760.

The on-board network I/F 7680 is an interface that mediates communication between the microcomputer 7610 and the communication network 7010. The on-board network I/F 7680 transmits and receives signals and the like in accordance with a predetermined protocol supported by the communication network 7010.

The microcomputer 7610 of the integrated control unit 7600 controls the vehicle control system 7000 according to various programs on the basis of information acquired via at least one of the general-purpose communication I/F 7620, the dedicated communication I/F 7630, the positioning unit 7640, the beacon reception unit 7650, the in-vehicle device I/F 7660, or the on-board network I/F 7680. For example, the microcomputer 7610 may calculate a control target value of the driving force generation device, the steering mechanism, or the braking device on the basis of the acquired information regarding the inside and outside of the vehicle, and output a control command to the drive system control unit 7100. For example, the microcomputer 7610 may perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, and the like. Furthermore, the microcomputer 7610 may perform cooperative control for the purpose of automated driving and the like in which the vehicle autonomously travels without depending on the operation of the driver by controlling the driving force generation device, the steering mechanism, the braking device, and the like on the basis of the acquired information around the vehicle.

The microcomputer 7610 may generate three-dimensional distance information between the vehicle and an object such as a surrounding structure or a person on the basis of information acquired via at least one of the general-purpose communication I/F 7620, the dedicated communication I/F 7630, the positioning unit 7640, the beacon reception unit 7650, the in-vehicle device I/F 7660, or the on-board network I/F 7680, and create local map information including surrounding information of the current position of the vehicle. Furthermore, the microcomputer 7610 may predict danger such as collision of the vehicle, approach of a pedestrian and the like, or entry into a closed road on the basis of the acquired information, and generate a warning signal. The warning signal may be, for example, a signal for generating a warning sound or turning on a warning lamp.

The audio image output unit 7670 transmits an output signal of at least one of a sound or an image to an output device capable of visually or audibly notifying a passenger of the vehicle or the outside of the vehicle of information. In the example of FIG. 34, an audio speaker 7710, a display unit 7720, and an instrument panel 7730 are illustrated as the output device. The display unit 7720 may include, for example, at least one of an on-board display or a head-up display. The display unit 7720 may have an augmented reality (AR) display function. The output device may be another device other than these devices, such as a wearable device such as a headphone or an eyeglass-type display worn by a passenger, a projector, or a lamp. In a case where the output device is a display device, the display device visually displays results obtained by various processing performed by the microcomputer 7610 or information received from another control unit in various formats such as text, images, tables, and graphs. Furthermore, in a case where the output device is a sound output device, the sound output device converts an audio signal including reproduced sound data, acoustic data, and the like into an analog signal and audibly outputs the analog signal.

Note that, in the example illustrated in FIG. 34, at least two control units connected via the communication network 7010 may be integrated as one control unit. Alternatively, each control unit may include a plurality of control units. Moreover, the vehicle control system 7000 may include another control unit (not illustrated). Furthermore, in the above description, some or all of the functions performed by any of the control units may be provided to another control unit. That is, as long as information is transmitted and received via the communication network 7010, predetermined arithmetic processing may be performed by any control unit. Similarly, a sensor or a device connected to any of the control units may be connected to another control unit, and a plurality of control units may mutually transmit and receive detection information via the communication network 7010.

An example of the vehicle control system to which the technology according to the present disclosure can be applied has been described above. The technology according to the present disclosure can be applied to, for example, the imaging units 7910, 7912, 7914, 7916, and 7918, the vehicle exterior information detection units 7920, 7922, 7924, 7926, 7928, and 7930, the driver state detection unit 7510, and the like, among the above-described configurations. Specifically, the imaging system 10 in FIG. 1 including the imaging device of the present disclosure can be applied to these imaging units and detection units. Then, by applying the technology according to the present disclosure, the influence of a noise event such as sensor noise can be mitigated, and the occurrence of a true event can be reliably and quickly sensed, in a manner that safe vehicle traveling can be realized.

Note that the present technology can have the following configurations.

(1) An imaging device including:
  a photoelectric conversion unit including a plurality of photoelectric conversion elements that performs photoelectric conversion to generate an electrical signal;

a setting unit that sets a threshold value according to a noise level of a predetermined area of the plurality of photoelectric conversion elements; and a first detection unit that detects a detection signal in a case where a change amount of the electrical signal generated by the plurality of photoelectric conversion elements exceeds the threshold value.

(2) The imaging device according to (1), in which
the photoelectric conversion elements in the predetermined area is shielded from light, and
photoelectric conversion elements other than the predetermined area each photoelectrically convert incident light to generate an electrical signal.

(3) The imaging device according to (2), in which the plurality of photoelectric conversion elements is arranged in a two-dimensional matrix, and a light shielding area where light is shielded corresponds to at least one of an arrangement of the photoelectric conversion elements in a row unit or an arrangement of the photoelectric conversion elements in a column unit.

(4) The imaging device according to (3), in which the arrangement of the photoelectric conversion elements in a row unit and the arrangement of the photoelectric conversion elements in a column unit include end portions of the plurality of photoelectric conversion elements arranged in a two-dimensional matrix.

(5) The imaging device according to any one of (1) to (4), in which the setting unit sets the threshold value on the basis of a number of absolute values of the change amount of the electrical signal generated by the photoelectric conversion elements in the predetermined area exceeding the threshold value in a predetermined period.

(6) The imaging device according to any one of (1) to (5), in which
the first detection unit detects a first detection signal when an absolute value of a change amount in a direction in which a signal level of the electrical signal increases exceeds a first threshold value, and detects a second detection signal when an absolute value of a change amount in a direction in which the signal level of the electrical signal decreases exceeds a second threshold value, and
the setting unit
sets the first threshold value on the basis of a number of absolute values of the change amount in the direction in which the signal level of the electrical signal generated by the electric conversion element in the predetermined area increases exceeding the first threshold value in a predetermined period, and
sets the second threshold value on a basis of a number of absolute values of the change amount in the direction in which the signal level of the electrical signal generated by the electric conversion element in the predetermined area decreases exceeding the second threshold value in a predetermined period.

(7) The imaging device according to any one of (1) to (5), in which the setting unit sets the threshold value in stages on the basis of a number exceeding the threshold value in the predetermined period.

(8) The imaging device according to (7), in which the setting unit decreases a change rate of the threshold value as time elapses.

(9) The imaging device according to (8), in which the setting unit decreases the change rate of the threshold value in a manner that the value asymptotically approaches an initial setting value.

(10) The imaging device according to (8), in which after setting the threshold value to a threshold value in a first stage, the setting unit decreases the change rate in a manner that the rate asymptotically approaches a predetermined setting value.

(11) The imaging device according to any one of (1) to (10), in which the setting unit does not change the threshold value in a case where a number exceeding the threshold value in a predetermined period is less than a predetermined value.

(12) The imaging device according to any one of (1) to (10), in which the setting unit sets the threshold value according to temperatures corresponding to the plurality of photoelectric conversion elements.

(13) The imaging device according to (12), in which the setting unit increases the change rate of the threshold value as a change in the temperature increases.

(14) The imaging device according to any one of (1) to (13), in which
the first detection unit sequentially reads the electrical signals of the photoelectric conversion elements in the predetermined area, and
the setting unit counts the number of the detection signals exceeding the threshold value over a predetermined period.

(15) An imaging method including:
setting a threshold value according to a noise level of a light-shielded photoelectric conversion element; and
detecting a detection signal in a case where an absolute value of a change amount of an electrical signal generated by the plurality of photoelectric conversion elements each of which photoelectrically converts incident light to generate the electrical signal exceeds the threshold value.

Aspects of the present disclosure are not limited to the above-described individual embodiments, and include various modifications that can be conceived by those skilled in the art, and the effects of the present disclosure are not limited to the above-described contents. That is, various additions, modifications, and partial deletions can be made without departing from the conceptual idea and scope of the present disclosure derived from the contents defined in the claims and their equivalents.

REFERENCE SIGNS LIST

10 Imaging system
20 Imaging device
21 Pixel array unit
21a Light shielding area
21b Light receiving area
22 Drive unit
23 Arbiter unit
24 Column processing unit
25 Signal processing unit
26 Setting unit
26a Counting unit
26b Threshold value control unit
30 Pixel
31 Light receiving unit
33 Address event detection unit

The invention claimed is:
1. An imaging device, comprising:
a photoelectric conversion unit that includes a first plurality of photoelectric conversion elements, wherein the first plurality of photoelectric conversion elements is configured to:

perform photoelectric conversion; and
generate a plurality of electrical signals based on the photoelectric conversion;
a setting unit configured to set a plurality of threshold values based on a noise level of a first area of the photoelectric conversion unit, wherein the first area includes the first plurality of photoelectric conversion elements; and
a first detection unit configured to:
detect a first detection signal based on a first absolute value of a first change amount that exceeds a first threshold value of the plurality of threshold values, wherein
the first change amount is associated with an electrical signal of the plurality of electrical signals, and
the first change amount is in a direction of an increase in a signal level of the electrical signal; and
detect a second detection signal based on a second absolute value of a second change amount that exceeds a second threshold value of the plurality of threshold values, wherein
the second change amount is associated with the electrical signal,
the second change amount is in a direction of a decrease in the signal level of the electrical signal,
the first detection signal is different from the second detection signal,
the first threshold value is different from the second threshold value, and
the first absolute value is different from the second absolute value.

2. The imaging device according to claim 1, wherein
the first plurality of photoelectric conversion elements in the first area is shielded from incident light,
the photoelectric conversion unit further includes a second plurality of photoelectric conversion elements,
each of the second plurality of photoelectric conversion elements is configured to:
photoelectrically convert the incident light; and
generate the electrical signal based on the photoelectric conversion of the incident light,
the second plurality of photoelectric conversion elements is in a second area of the photoelectric conversion unit,
the second area is different from the first area, and
the first plurality of photoelectric conversion elements is different from the second plurality of photoelectric conversion elements.

3. The imaging device according to claim 2, wherein
each of the first plurality of photoelectric conversion elements and the second plurality of photoelectric conversion elements is in a two-dimensional matrix,
the first area corresponds to a light shielding area, and
the light shielding area corresponds to at least one of a first arrangement of the first plurality of photoelectric conversion elements in a row unit or a second arrangement of the first plurality of photoelectric conversion elements in a column unit.

4. The imaging device according to claim 3, wherein each of the first arrangement and the second arrangement includes end portions of the first plurality of photoelectric conversion elements.

5. The imaging device according to claim 1, wherein
the setting unit is further configured to set each of the plurality of threshold values based on a number of absolute values that exceeds one of the first threshold value or the second threshold value in a specific period, and
the number of absolute values is associated with at least one of the first change amount or the second change amount.

6. The imaging device according to claim 1, wherein
the setting unit is further configured to:
set the first threshold value based on a number of absolute values that exceeds the first threshold value in a specific period, wherein the number of absolute values is associated with the first change amount, and
set the second threshold value based on the number of absolute values that exceeds the second threshold value in the specific period, wherein the number of absolute values is associated with the second change amount.

7. The imaging device according to claim 5, wherein the setting unit is further configured to set each of the plurality of threshold values in stages based on a specific number that exceeds one of the first threshold value or the second threshold value in the specific period.

8. The imaging device according to claim 7, wherein the setting unit is further configured to decrease, with a time lapse, a change rate of each of the plurality of threshold values.

9. The imaging device according to claim 8, wherein the setting unit is further configured to asymptotically decrease the change rate of each of the plurality of threshold values to an initial setting value.

10. The imaging device according to claim 8, wherein
based on the plurality of threshold values, the setting unit is further configured to asymptotically decrease the change rate to a specific setting value.

11. The imaging device according to claim 1, wherein
the setting unit is further configured to retain a third threshold value of the plurality of threshold values based on a number less than a specific value in a specific period, and
the number exceeds one of the first threshold value or the second threshold value.

12. The imaging device according to claim 1, wherein the setting unit is further configured to set each of the plurality of threshold values based on each of a plurality of temperatures corresponding to each of the first plurality of photoelectric conversion elements.

13. The imaging device according to claim 12, wherein the setting unit is further configured to increase a change rate of each of the plurality of threshold values based on an increase in each of the plurality of temperatures.

14. The imaging device according to claim 1, wherein
the first detection unit is further configured sequentially read the generated plurality of electrical signals,
the setting unit is further configured to count a number of detection signals that exceed at least one of the first threshold value or the second threshold value in a specific period, and
the detection signals include the first detection signal and the second detection signal.

15. An imaging method, comprising:
setting a plurality of threshold values based on a noise level of a light-shielded photoelectric conversion element;

detecting a first detection signal based on a first absolute value of a first change amount that exceeds a first threshold value of the plurality of threshold values, wherein
 the first change amount is associated with an electrical signal, and
 the first change amount is in a direction of an increase in a signal level of the electrical signal; and
detect a second detection signal based on a second absolute value of a second change amount that exceeds a second threshold value of the plurality of threshold values, wherein
 the second change amount is associated with the electrical signal,
 the second change amount is in a direction of a decrease in the signal level of the electrical signal,
 the first detection signal is different from the second detection signal,
 the first threshold value is different from the second threshold value, and
 the first absolute value is different from the second absolute value.

* * * * *